United States Patent
Towner et al.

(10) Patent No.: US 9,414,531 B1
(45) Date of Patent: Aug. 9, 2016

(54) MODULAR DATA CENTER WITHOUT ACTIVE COOLING

(71) Applicant: Amazon Technologies, Inc., Reno, NV (US)

(72) Inventors: Richard Chadwick Towner, Front Royal, VA (US); Kraig Knight, Ashburn, VA (US); John William Eichelberg, Spokane, WA (US); Peter George Ross, Olympia, WA (US)

(73) Assignee: Amazon Technologies, Inc., Reno, NV (US)

( * ) Notice: Subject to any disclaimer, the term of this patent is extended or adjusted under 35 U.S.C. 154(b) by 135 days.

(21) Appl. No.: 14/495,366

(22) Filed: Sep. 24, 2014

(51) Int. Cl.
*G06F 1/20* (2006.01)
*H05K 5/00* (2006.01)
*H05K 7/20* (2006.01)

(52) U.S. Cl.
CPC ................... *H05K 7/20745* (2013.01)

(58) Field of Classification Search
CPC ....... H05K 7/20745; H05K 7/20009–7/20181; H05K 7/2019; H05K 7/202; H05K 7/20209; G06F 1/20–1/203
USPC ............... 361/679.46, 679.47, 679.49, 679.5, 361/695; 454/184–186, 188–193, 228–368
See application file for complete search history.

(56) References Cited

U.S. PATENT DOCUMENTS

| | | | | |
|---|---|---|---|---|
| 7,278,273 | B1* | 10/2007 | Whitted | H05K 7/1497 361/690 |
| 7,990,710 | B2* | 8/2011 | Hellriegel | G06F 1/183 165/104.33 |
| 2012/0132554 | A1* | 5/2012 | Wei | H05K 7/20727 206/320 |
| 2012/0142265 | A1* | 6/2012 | Wei | H05K 7/20745 454/184 |
| 2013/0050923 | A1* | 2/2013 | Wei | H05K 7/20745 361/679.5 |
| 2014/0150999 | A1* | 6/2014 | Wei | H05K 7/20745 165/121 |
| 2014/0182812 | A1* | 7/2014 | Lin | H05K 7/20745 165/57 |
| 2015/0083363 | A1* | 3/2015 | Lindenstruth | H05K 7/20745 165/47 |

* cited by examiner

*Primary Examiner* — Anthony Haughton
*Assistant Examiner* — Yahya Ahmad
(74) *Attorney, Agent, or Firm* — Robert C. Kowert; Meyertons, Hood, Kivlin, Kowert & Goetzel, P.C.

(57) ABSTRACT

A modular computing system for a data center includes one or more data center modules including rack computer systems. An electrical module is coupled to the data center modules and provides electrical power to computer systems in the data center modules. The data center modules do not include any internal active cooling systems and cannot be coupled with any external active cooling systems. A data center module directs ambient air to flow into intake air plenums extending along intake sides of the rows of racks, through the rows of racks into exhaust plenums extending along exhaust sides of the rows of racks, and out into the ambient environment to cool computer systems in the racks. Directed airflow can be lateral, vertical, at least partially driven by air buoyancy gradients, at least partially induced by air moving devices internal to computer systems in the rows of racks, thereof, etc.

20 Claims, 11 Drawing Sheets

MODULAR DATA CENTER WITHOUT ACTIVE COOLING

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to effect. Substantial time and resources are typically required to design and build a data center (or expansion thereof), lay cables, install racks and cooling systems. Additional time and resources are typically needed to conduct inspections and obtain certifications and approvals, such as for electrical and HVAC systems.

Waste heat removal systems often use mechanical systems that use moving parts to facilitate waste heat removal from the data centers. For example, some waste heat removal systems in some data centers may utilize blowers, fans, or the like to induce one or more flows of air, including exhaust air, to transport waste heat out of the data center. Such systems usually consume electricity and may themselves generate waste heat, further increasing the amount of waste heat that must be removed from the data center and necessitating the mechanical systems to be enlarged to handle the greater waste heat load. Furthermore, due to having moving parts, such systems are subject to wear and often require periodic maintenance and replacement of components to maintain heat removal capabilities. In addition, mechanical systems impose additional complexity into deployment and operation of computing capacity, as mechanical systems require time and expenditure to be installed, coupled to heat producing components to be cooled by the mechanical systems, coupled to power sources, and maintained. Because heat producing systems which require mechanical systems to operate, deployment of such heat producing systems may necessarily require the presence, or deployment of, such mechanical systems to provide cooling of the heat producing systems. As a result, the ability to rapidly increase or decrease computing capacity at a location, may at least partially depend upon an ability to rapidly deploy, operate, remove, etc. one or more mechanical systems to provide cooling to the computing capacity at the location.

Figure 1:
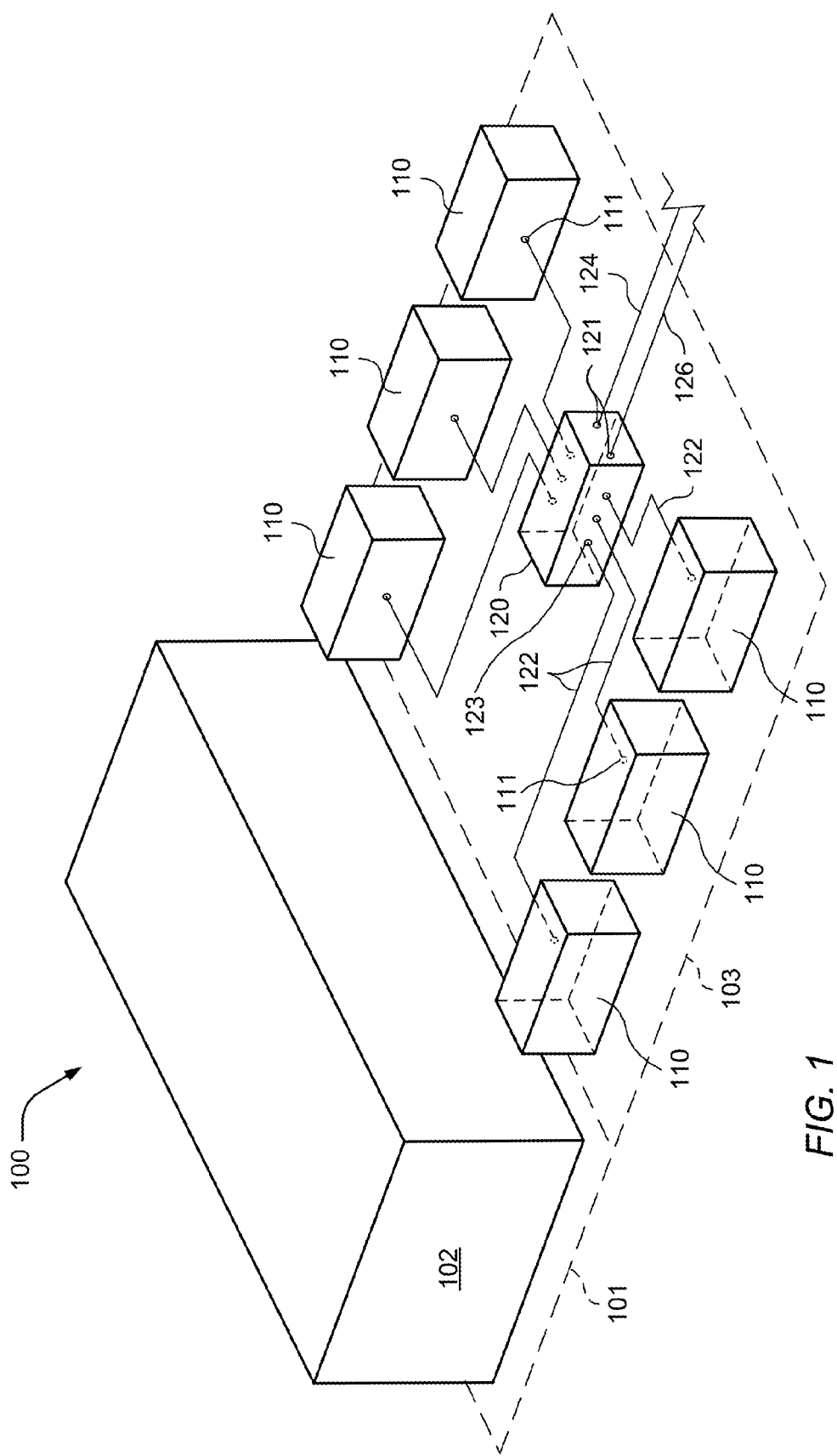
FIG. 1 illustrates a perspective view of a data center site including data center modules and electrical modules which provide modular computing capacity with a data center hall configured to provide permanent computing capacity, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a modular system for a data center are disclosed. According to one embodiment, a modular computing system for a data center includes one or more data center modules, which include a module hosing and a row of rack computer systems, and one or more electrical modules coupled to one or more of the data center modules. The module housing includes a front face, a rear face, and opposite side faces. The row of rack computer systems extends between opposite side faces in an interior of the module housing, and each of the rack computer systems includes a front face proximate to the front face and a rear face proximate to the rear face. An electrical module provides electrical power to a rack computer system in the coupled data center modules. Each data center module does not include any connections to any active cooling system and removes heat from the rack computer systems in the data center module independently of any active cooling system. Such heat removal includes directing a flow of ambient air from an ambient environment, through the front face, through the row of rack computer systems from the front face to the rear face, and back into the ambient environment via the rear face.

According to one embodiment, an apparatus includes a data center module which does not include any active cooling system connections and provides computing capacity independently of any active cooling system. Such a data center module includes a module housing, a row of rack computer systems, an intake air opening, and an exhaust air opening. The housing at least partially encompasses a module interior. The row of rack computer systems extends, in the module interior, between opposite side faces of the module housing. The intake air opening directs air from an ambient environment into an intake plenum of the module interior which is proximate to an intake end of the row of rack computer systems. The exhaust air opening direct airs, from an exhaust plenum which is proximate to an exhaust end of the row of rack computer systems, out of the module interior and into the ambient environment. To provide computing capacity independently of any active cooling system, the data center module directs a flow of ambient air from the ambient environment, through the intake air opening into the intake plenum, from the intake plenum to the exhaust plenum through one or more rack computer systems in the row of rack computer systems, and through the exhaust air opening from the exhaust plenum to the ambient environment.

According to one embodiment, a method of providing computing capacity includes positioning one or more pre-fabricated data center modules comprising one or more rack computer systems at a data center site, coupling one or more pre-fabricated electrical modules to at least one of the data center modules, and operating a pre-fabricated data center module at the site to provide computing capacity, at the data center site, independently of any active cooling system. The pre-fabricated data center modules do not include any active cooling system connections and provide computing capacity independently of any active cooling system. The electrical modules provide one or more of electrical power support and network communication support to at least one rack computer system in one or more of the data center modules.

As used herein, an "aisle" means a space next to one or more racks.

As used herein, "ambient" refers to a condition of outside air at the location of a system or data center. An ambient temperature may be taken, for example, at or near an intake hood of an air handling system.

As used herein, "computing" includes any operations that can be performed by a computer, such as computation, data storage, data retrieval, or communications.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center module" means a module that includes, or is suitable for housing and/or physically supporting, one or more computer systems that can provide computing resources for a data center.

As used herein, "infrastructure module" means a module that provides one or more types of infrastructure support to systems or components external to the infrastructure module. Such types of infrastructure support can include electrical power support provided via distribution of electrical power, network communication support provided via communicative coupling of one or more systems or components with one or more communication networks, some combination thereof, etc. An infrastructure module can include one or more of an electrical module, network communication module, etc.

As used herein, "electrical module" means a module that distributes electrical power to systems or components external to the electrical module.

As used herein, "network communication module" means a module which communicatively couples one or more systems or components external to the network communication module with one or more communication networks.

As used herein, "external cooling system" means a cooling system external to a modular computing system. For example, an external cooling system may be a chilled water system that is coupled to a modular computing system. An external cooling system may be located inside a facility or outdoors.

As used herein, a "free cooling" includes operation in which an air handling system pulls air at least partially from an external source (such as air outside a facility) and/or a return from a computer room, and forces the air to electronic equipment without active chilling in the air-handling subsystem.

As used herein, "active cooling", "active chilling", etc. refers to cooling of air by a process which involves transferring heat from the air to one or more other fluids which are separate from the air. Such other fluids can include water, various coolants, refrigerants, some combination thereof, etc. Active cooling systems can include heat exchangers which remove heat from the one or more other fluids. An example of an active cooling system can include a cooling system which includes circulating air through a data center module to remove heat from heat producing components therein, and circulating a separate fluid through one or more pathways in the data center module, including pipes, coils, heat exchangers, etc. to cool the circulating air before the air removes heat from such components, after the air removes heat from such components, concurrently with the air removing heat from such components, some combination thereof, etc. Another example of an active cooling system includes chilled water cooling systems. An example of active cooling includes cooling air by a process which includes mechanical cooling. An example of active cooling includes cooling air by a process which includes evaporative cooling.

As used herein, "mechanical cooling" means cooling of air by a process that involves doing mechanical work on at least one other fluid, such as occurs in vapor-compression refrigeration systems, etc.

As used herein, "evaporative cooling" means cooling of air by evaporation of liquid.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, "movable" means a component or combination or components having a container, housing, frame or other structure that allows the module to be moved as a unit from one location to another. For example, a movable module may be moved as a unit on a flatbed trailer. In some cases, a movable module may be attached to a portion of a floor, building, or permanent structure when deployed. For example, a movable module may be bolted to the floor of a data center facility.

As used herein, "power distribution unit" refers to any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.)

As used herein, a "rack" means rack, container, frame, or other element or combination of elements that can contain or physically support one or more computer systems.

As used herein, a "space" means a space, area or volume.

FIG. 1 illustrates a perspective view of a data center site including data center modules and electrical modules which provide modular computing capacity with a data center hall configured to provide permanent computing capacity, according to some embodiments.

Data center site 100 includes a first location in which a data center hall 102 is located and a second location 103 in which multiple modules 110, 120 are located. Such modules include data center modules 110 and infrastructure module 120. Data center hall 102 can include one or more sets of rack computer systems included therein which can provide computing capacity at the data center site 100. In addition, each of data center modules 110 can include one or more sets of rack computer systems, included therein, which can provide computing capacity at the data center site 100.

In some embodiments, a data center hall 102 is constructed at a data center site 100 to provide permanent computing capacity at the site 100. A completed data center hall 102 can include one or more sets of rack computer systems, in an interior space therein, including one or more computer rooms. The sets of rack computer systems, which can include one or more rows of rack computer systems, can perform computing operations to provide such computing capacity. Data center hall 102, in some embodiments, includes electrical power components, including one or more power distribution systems, to provide electrical power to the various rack computer systems in the data center hall 102 to support computing operations by the rack computer systems therein. Such electrical power components can include various electrical power components, including one or more transformers, generators, transfer switches, uninterruptible power supplies (UPSs), power distribution units (PDUs), automatic transfer switches (ATSs), etc. In addition, the data center hall 102 can include network communication components, including network switch devices, console switch devices, routers, etc., which communicatively couple the rack computer systems to a communication network to support remote access to the rack computer systems.

In some embodiments, a fixed data center hall 102 includes one or more air cooling systems which provide cooling of the rack computer systems in the hall 102 via heat removal from said rack computer systems. Such air cooling systems can include active cooling systems, which can include various mechanical cooling systems, evaporative cooling systems, etc.

In some embodiments, construction of hall 102, and installation of various rack computer systems and supporting infrastructure, including electrical power components, network communication components, air cooling components, cabling, etc., can require a considerable elapse of time from the start of construction before the hall is actually configured to provide at least some computing capacity via installed and electrically, cooling, network communication-supported rack computer systems. As a result, constructing data center hall 102 at site 100 may provide computing capacity at a rate which is less than a desired rate of computing capacity deployment at the site 100. As used herein computing capacity "deployment" can refer to installing one or more sets of rack computer systems and sufficient instances of supporting infrastructure at a site so that the rack computer system can perform computing capacity at the site. Deployment of computing capacity via hall 102, also referred to herein as "fixed computing capacity", can include at least partially constructing the structure of the hall 102 at the site 100, which can include constructing foundations, structural support beams, walls, ceilings, floors, etc.; installing rack computer systems in the interior space of the hall, including one or more computer rooms therein; and installing one or more instances of electrical, network communication, air cooling, structural support, cabling infrastructure, etc. Such a deployment of fixed computing capacity via construction of hall 102 can be time-consuming.

In some embodiments, computing capacity at a data center site can be rapidly deployed, relative to the rate at which computing capacity is deployed through construction of a fixed data center hall 102 at the site 100 to provide fixed computing capacity, based at least in part upon installing movable data center modules 110 and movable infrastructure modules 120 to provide movable computing capacity via rack computer systems in the data center modules 110.

In some embodiments, deployment of movable computing capacity at a data center site via data center modules can include separately transporting various data center modules 110 and infrastructure modules 120 to the second location 103, positioning the various modules 110, 120 in the location 103, coupling the infrastructure module 120 to one or more power sources and communication networks, and coupling the data center modules 110 to the infrastructure modules 120, via conduits 122 coupling respective external connections 111, 123 of the respective modules 110, 120 to configure modules 110 to receive infrastructure support via module 120 to perform computing operations and to provide computing capacity. Module 120 can provide one or more of electrical and network communication support to the data center modules 110 to support computing operations by said modules 110. In some embodiments, one or more of the modules 110, 120 are prefabricated and in a form in accordance with at least one standard for shipping containers, so that each separate module 110, 120 can be separately shipped to the site 100, via one or more separate delivery vehicles (e.g., semi-trailers, flatbed trailers, delivery trucks, etc.) and mounted in a position in the location 103.

In some embodiments, where the modules 110, 120 are pre-fabricated, construction of the modules, installation of racks and cabling infrastructure therein, installation of individual infrastructure components, etc. at the site 100 is precluded, as installation of such components includes shipping (also referred to as "delivering", "transporting", etc.) a module to the site, placing a module on a surface in the location 103 and coupling the module, via one or more external connections, to external systems, services to provide support to the module. Such modules 110, 120 can be constructed off-site, including at a separate fabrication facility, and the modules 110, 120 can be stored in a storage location until a determination is made that computing capacity is needed at the site. Upon such a determination, a number of rack computer systems associated with the needed computing capacity, and a number of infrastructure modules which can provide a sufficient quantity of one or more types of infrastructure support to support computing operations by the number of rack computer systems, can be selected and transported to the site, separately, together on a common delivery vehicle, some combination thereof, etc. Upon arrival at the site 100, the various modules 110, 120 can be mounted in various locations in location 103 (such mounting can be referred to as "positioning"), and the modules 110, 120 can be coupled together to configure the data center modules 110 to perform computing operations to provide computing capacity and for the infrastructure modules 120 to provide infrastructure support to the modules 110 to support the computing operations by the modules 110.

In some embodiments, each module, prior to shipment to a site, can be pre-certified by a Nationally Recognized Testing Laboratory. In certain embodiments, modules 110, 120 may be UL-listed and/or ETL-listed. A modular computing system, or portions of a modular computing system can be ETL SEMKO, CE/ETSI, or UL stamped. In some embodiments, having a certified module 110, 120 will reduce the scope of a building inspection. For example, the electrical inspector may only inspect the cable connections between the external connections of modules 110, 120, the connections of any additional data center modules added after the initial deployment, etc. A modular computing system may thus in some embodiments be a self-contained system with the capability of rapid deploy, with only minor utility and fiber connections, which generally require only over-the-counter permits.

Because movable computing capacity provided via modules 110, 120 is deployed via transporting, positioning, and coupling individual modules at a site, the quantity of computing capacity provided at the site can be rapidly deployed and adjusted as needed. Structural construction can be minimized, as foundation construction, structural beam construction, etc. is not required for such deployment, and installation of conduit infrastructure can be restricted to coupling the separate modules together and to external systems and services via external connections 111, 123, 121 and conduits 122, 124, 126, so that routing cabling infrastructure to and between the individual rack computers systems, components, etc. at the site is precluded (such routing and coupling of infrastructure within a given module 110, 120 can be implemented during off-site construction of the module, prior to storage or shipment to site 100). For example, location 103 can be a gravel surface, concrete surface, soil surface, repurposed parking lot, previously empty field, etc. As a result, deployment of movable computing capacity in location 103, via positioning and coupling of modules 110, 120 can be more rapid than deployment of fixed computing capacity in location 101, via construction of data center hall 102. In addition, if additional computing capacity is needed, additional modules 110, 120 can be transported to the site 100 and positioned and coupled to deploy the additional movable capacity, while data center hall 102 may require substantial redesign, add-on construction, extension, etc. to deploy additional fixed computing capacity.

Furthermore, in some embodiments, such modules 110, 120 can be decoupled from each other and removed from location 103 to remove computing capacity from site 100. Thus, the computing capacity deployed and provided via modules 110, 120 can be reversible, so that the capacity can be provided and removed without fundamentally altering location 103, while data center hall 102 may not be removed without substantial effort involving decoupling components, racks, etc. from infrastructure, removing said infrastructure, deconstructing the hall 102 structure, removing foundation elements, resurfacing location 101, etc.

In some embodiments, modules 110, 120 can be used to provide temporary computing capacity at a site 100, concurrently with construction of a data center hall 102 at the site 100, so that computing capacity can be rapidly deployed to site 100 prior to the hall 102 being completed and configured to provide computing capacity. As the hall 102 is at least partially completed and begins to provide computing capacity via installed rack computer systems and supporting infrastructure, modules 110, 120 can be removed from site 100 and returned to a storage location. Such removal, and thus reduction of computing capacity in location 103, can be progressive and complementary to increases in computing capacity provided via hall 102. Thus, a certain amount of computing capacity can be provided at site 100, and the source of the capacity can be progressively switched from movable computing capacity provided by the modules 110, 120 to fixed computing capacity provided by the hall 102 as the hall 102 is progressively completed.

In some embodiments, infrastructure module 120 is absent, and installation of each data center module 110 includes individually coupling each individual module 110 with a communication network and power source via an electrical power connection, network communication connection of the respective module. One or more external connections 111 of a data center module 110 can comprise an electrical power inlet connection configured to receive power from external power sources and distribute said electrical power to each of the rack computer systems mounted in the interior space of the data center module, via instances of electrical power cabling extending therein, and one or more external connections 111 of the module can comprise a network communication connection configured to communicatively couple the various rack computer systems to the communication pathway coupled to the network communication connection, via various instances of network communication cabling extending between the network communication connection and the rack computer systems in the module interior.

In some embodiments, the data center modules 110 are configured to provide computing capacity independent of any internal or external active cooling systems, so that deploying computing capacity via modules 110, 120 does not include installing active cooling systems, providing coolants, etc. For example, each of modules 110 can be configured to remove heat from rack computer systems therein via "free cooling" of the rack computer systems, so that circulation of ambient air into, through, and out of a given module 110 removes heat generated by rack computer systems in the module into the ambient environment. Because no active chilling is used, and the modules 110 are configured to not use same, moving parts associated with heat removal may be absent from the modules 110, external to the rack computer systems therein. Airflow through the modules 110 to free-cool rack computer systems can be induced based at least in part upon the structure of the modules 110. In some embodiments, one or more air moving devices included in a module 110, including air moving devices included in the rack computer systems included in the module 110, at least partially induce airflow into the module 110 interior from an ambient environment, through the module interior, and back out into the ambient environment from the module 110 interior, to free-cool the rack computer systems in the module. In addition, because no active chilling (e.g., circulation of a coolant fluid that removes heat from the ambient air) is used, the modules 110 are configured to not include any internal active cooling systems, nor any connections to any external cooling systems which include an active cooling system, so that installation of active cooling systems in location 103 is precluded in order to deploy computing capacity in location 103 via modules 110. Because installation of active cooling systems, including providing and operating such systems, is not included in deploying computing capacity of modules 110, such deployment of modules 110 is simplified, relative to systems which are designed to remove heat from computer systems via active chilling of air, etc.

In addition, although some data center modules may be configured to circulate coolant through the module interior to remove heat and can also free-cool the racks as an alternative cooling system, such modules, by being configured to accommodate active cooling, include additional design complexity to accommodate coolant lines, pumps, valves, mitigate risk of component failure due to coolant leaks, etc. However, data center modules 110, by being configured to not connect with any active cooling systems, are simplified in structure by precluding a need to accommodate active cooling system components and mitigate damage from coolant leaks.

In some embodiments, the infrastructure modules 120 include one or more electrical modules configured to provide electrical power to rack computer systems in one or more data center modules, network communication modules configured to provide network communication access to the rack computer systems in one or more data center modules, some combination thereof, etc. For example, a infrastructure module 120 can include one or more instances of electrical power distribution components (e.g., transformers, generators, switching devices, uninterruptible power supplies, power distribution units, some combination thereof, or the like), one or more instances of network communication components (e.g., network switch devices, console switch devices, routers, etc.), some combination thereof, or the like.

In the illustrated embodiment, the deployed computing capacity in location 103 includes data center modules 110 which are positioned in various locations in location 103, an infrastructure module 120 positioned in location 103, a conduit 124, which can include a power transmission line, which couples an external connection 121 of the infrastructure module 120, which can include a power inlet connection, to a power source to configure the module 120 to receive electrical power from a power source. The module 120 further includes an external connection 121, which can include a network communication connection which can connect with a conduit 126, which can include network communication cabling, which communicatively couples the module 120 to a communication network, and multiple conduits 122 which couple the module 120, via various external connections 123, to the various modules 110 in location 103, via conduits coupling with external connections 111 of the modules 110, to provide power support, network communication support, etc. to the modules 110 via module 120. In some embodiments, one or more conduits 122 include an electrical power cable, coupling a power outlet connection 123 of module 120 with a corresponding power inlet connection 111 of a given data center module 110. In some embodiments, one or more conduits 122 include a network communication cable, coupling a communication connection 123 of module 120 with a communication connection 111 of a given module 110.

Infrastructure module 120 can be coupled to an external source of electrical power, such as a utility feed 124. Module 120 can distribute electrical power to data center modules 110 via one or more conduits 122, which can include one or more instances of power cabling. Module 120 can include one or more instances of switchgear, mechanical distribution panels, uninterruptible power supplies (UPS), power distribution units (PDU), transformers, transfer switches, generators, etc. In some embodiments, module 120 includes all of the electrical power distribution equipment associated with the modular computing system. In some embodiments, module 120 includes a 1600-ampere ATS, 2 UPSs at 550 kW each, a critical distribution panel, main distribution panels, and a mechanical distribution panel. In some embodiments, electrical power at 480/277Y voltage is distributed to racks in data center modules.

In some embodiments, first location 101 and second location 103 are remotely located relative to each other, and the data center modules 110 positioned at location 103 can be communicatively coupled to the data center hall 102 via one or more network connections. For example, in some embodiments, location 103 is located at a site which is geographically remote from a site at which location 101 is located. In some embodiments, data center modules 110 are positioned at location 103 to provide additional computing capacity for a previously-constructed and completed data center hall 102. For example, where a certain amount of additional computing capacity is required at data center hall 102, a number of data center modules 110 which collectively provide the certain amount of additional computing capacity can be installed at location 103 and communicatively coupled to data center hall 102 via a network connection. Such additional computing capacity can be provided in response to a temporary requirement for such computing capacity, including a temporary loss of a certain amount of fixed computing capacity at data center hall 102. In some embodiments, data center modules 110 can be positioned at location 103 to provide permanent computing capacity at location 103.

Figure 2:
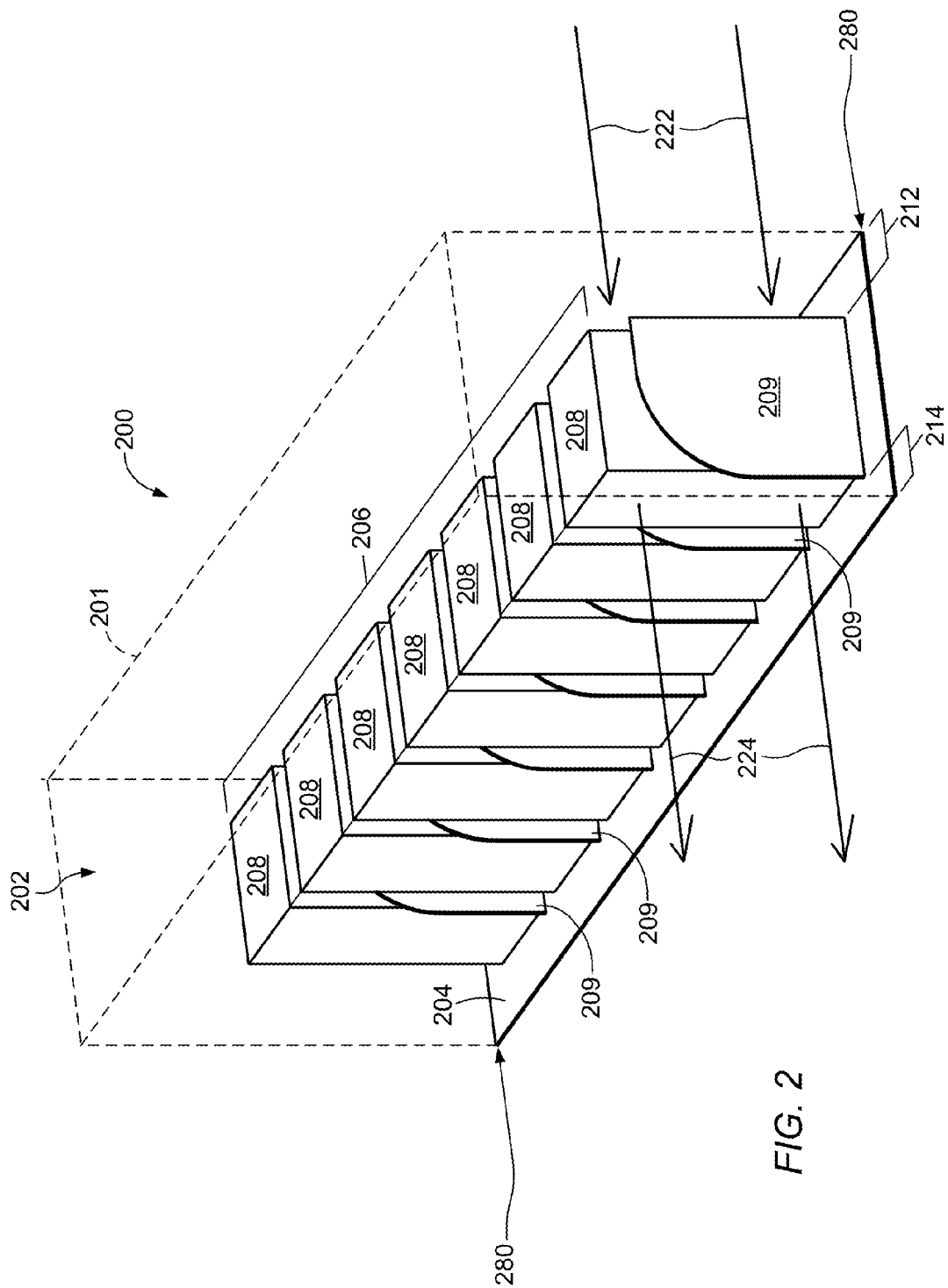
FIG. 2 illustrates a perspective view of an interior of a data center module which includes one or more rows of rack computer systems, according to some embodiments.

FIG. 2 illustrates a perspective view of an interior of a data center module which includes one or more rows of rack computer systems, according to some embodiments. The data center module 200 illustrated in FIG. 2 can be included, in some embodiments, in one or more data center modules 110 illustrated in FIG. 1, etc.

Data center module 200 includes housing 201 which at least partially encompasses an interior 202 of the housing 201. The housing 201 includes a bottom end 204, which can include a floor of the interior 202, onto which a row 206 of rack computer systems 208 are installed and extend between opposite side faces 280 of the module 200. The rack computer systems 208 can perform computing operations to provide computing capacity in the module 200. In some embodiments, each rack computer system 208 can be at least partially secured in place in the interior 202 via a given pair of dividers 209. The row of rack computer systems 208 included in module 200 can perform computing operations, such that module 200 is configured to provide movable computing capacity via the rack computer systems 208.

In some embodiments, the row of rack computer systems in the data center module housing interior are arranged in the interior 202 to establish spaces on one or more sides of the row of racks. As shown, module interior 202 includes a front aisle 212 extending along a front side of the row 206 and a rear aisle 214 extending along a rear side of the row 206. Each aisle 212, 214 can at least partially establish a separate air plenum extending along a respective side of the row of rack computer system. For example, aisle 212 and row 206 can at least partially establish an intake air plenum, extending along a front face of the row 206 and along aisle 212, into which a flow 222 of air is directed by module 200 from an ambient environment, and from which the flow 222 of air is directed through the rack computer systems 208 in the row 206. In addition, aisle 214 and row 206 can at least partially establish an exhaust air plenum, extending along a rear face of the row 206 and along aisle 214, into which a flow 224 of exhaust air is directed by module 200 from the row 206 of racks 208, and from which the flow 224 of air is directed out of the interior 202 and into the ambient environment.

As shown in the illustrated embodiment, airflow 222 into the front end of the rack computer systems via aisle 212, and airflow out of the rack computer systems 208 and out of module 200 via aisle 214, flow at least partially orthogonally relative to the direction along which the row 206 of racks extend. Each rack computer system 208 in a row 206 of rack computer systems can have a front end facing towards aisle 212, so that airflow 222 into module 200 and through aisle 212 flows towards the front end of each of the rack computer systems 208 in the row 208. Similarly, each rack computer system 208 in a row 206 of rack computer systems can have a rear end facing towards aisle 214, so that airflow 224 through aisle 214 and out of module 200 flows away from the rear end of each of the rack computer systems 208 in the row 208. As a result, said airflows 222, 224 can be referred to as flowing at least partially orthogonally, perpendicularly, etc. relative to the row 206 of rack computer systems 208.

Figure 3A:
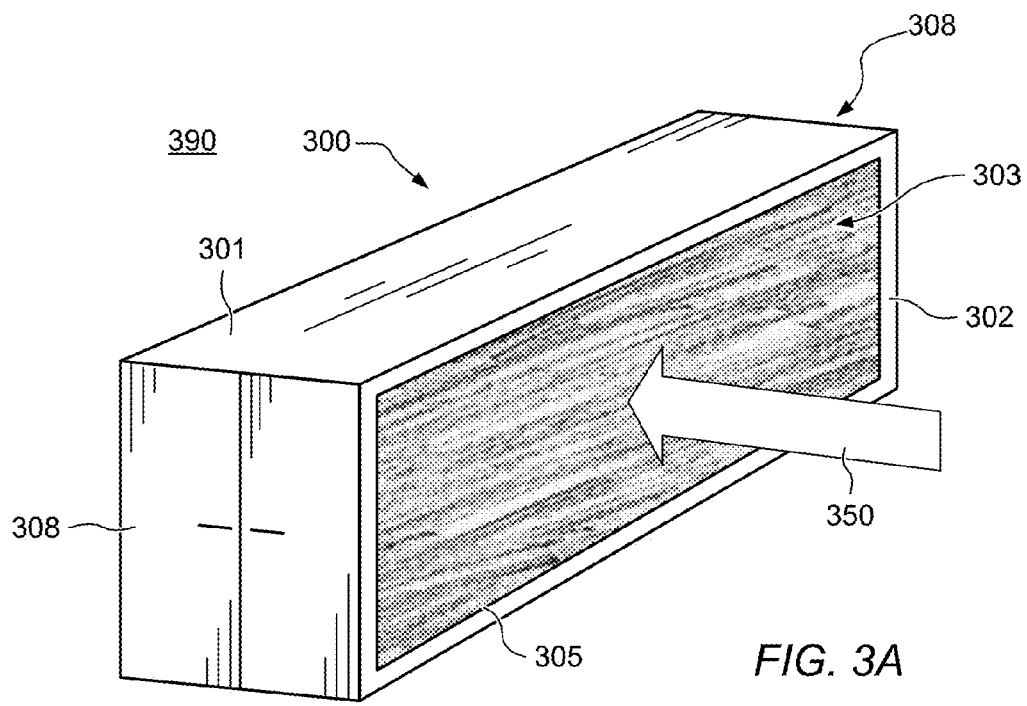
FIG. 3A-B illustrate perspective front and rear views of a data center module configured to direct a lateral flow of air through the module interior to remove heat from one or more rows of rack computer systems, according to some embodiments.
Figure 3B:
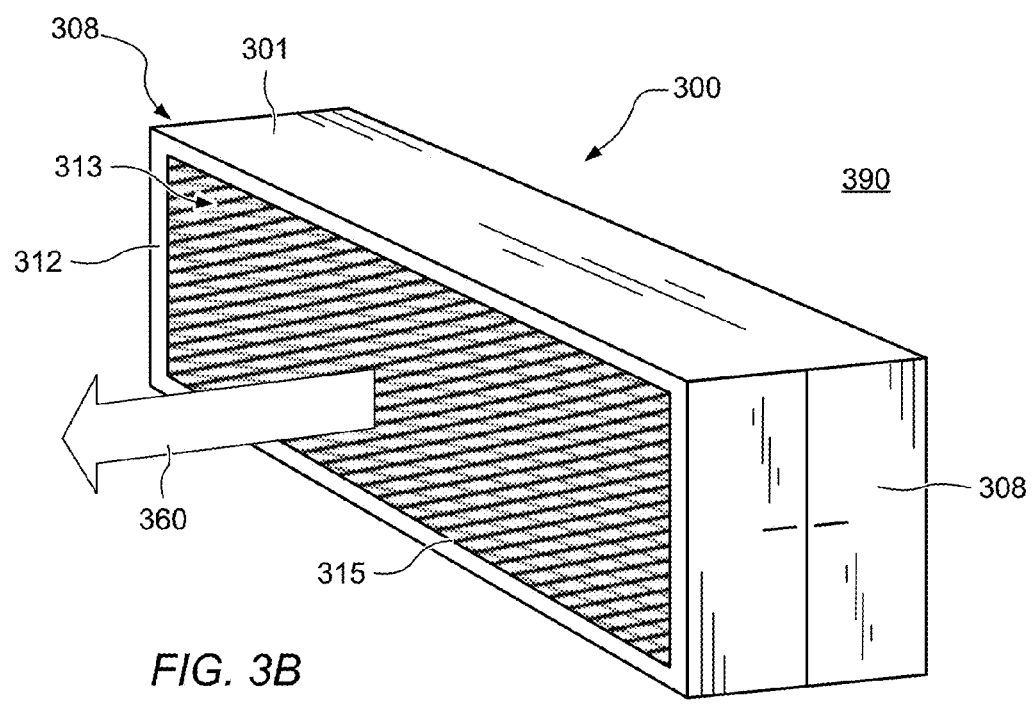

FIG. 3A-B illustrate perspective front and rear views of a data center module configured to direct a lateral flow of air through the module interior to remove heat from one or more rows of rack computer systems, according to some embodiments. The data center module 300 illustrated in FIG. 3A-B can be included, in some embodiments, in one or more data center modules 110 illustrated in FIG. 1, data center module 200 illustrated in FIG. 2, etc.

Data center module 300 includes a module housing 301 which includes opposite side faces 308, a front face 302, and a rear face 312. Front face 302 includes an intake air opening 305 configured to direct ambient air from an ambient environment 390 into an interior of the module housing 301. Rear face 312 includes an exhaust air opening 315 configured to direct air from the module housing 301 interior into the ambient environment 390.

Data center module 300 is configured to direct a flow 350 of ambient air, as an intake air flow via the intake air opening 305 in the front face 302, into an interior of the housing 301. The data center module 300 is further configured to direct a flow 380 of air, as an exhaust air flow via the exhaust air opening 315 in the rear face 312, out of the interior of the housing 301 and into the ambient environment 390. The flow 380 of air can include the flow 350 of air which has passed through a portion of the housing 301 interior and has removed heat from one or more heat producing components in the housing interior. Such heat producing components can be included in one or more rack computer systems included in the interior of the module housing 301.

Intake air opening 305 can include a filter assembly 303 which extends at least partially across the intake air opening 305 and is configured to at least partially filter environmental elements out of the air flow 350 into the module housing interior via opening 305. Such environmental elements can include particulate matter suspending in the air flow 350, precipitation in the ambient environment 390, etc. Rear air opening 315 can include a semi-permeable screen 313 which extends at least partially across the exhaust air opening 315 and is configured to at least partially preclude external access to the module housing interior via the rear air opening 315. Such a semi-permeable screen can include an expanded steel mesh structure, chain-link fence structure, etc. which may not filter environmental elements out of the air but can preclude various macro-scale elements, including animals, building materials, etc. from entering the housing 301 interior via opening 315.

In some embodiments, a data center module housing 301 is configured to have a form factor of a shipping container. In the illustrated embodiment, for example, module 301 has a form factor of a shipping container configured to be transported via at least a semi-trailer, rail flatbed car, cargo ship, etc. As a result, the module 300 can easily be mounted in a delivery vehicle and transported between locations. In addition, where the module 300 is in a storage location, multiple modules can be stacked horizontally, vertically, etc. relative to each other.

Figure 3C:
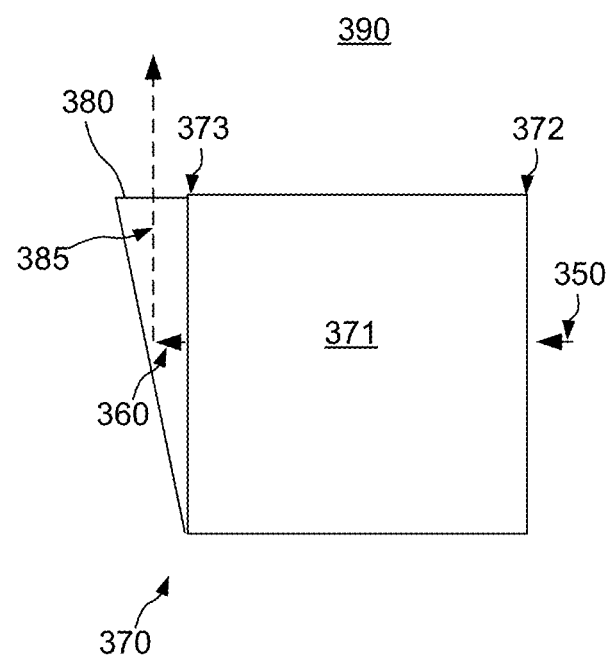
FIG. 3C illustrates an orthogonal view of a data center module comprising a scoop assembly coupled to a data center module housing, according to some embodiments.

FIG. 3C illustrates an orthogonal view of a data center module comprising a scoop assembly coupled to a data center module housing, according to some embodiments. The data center module 370 illustrated in FIG. 3C can be included, in some embodiments, in one or more data center modules 110 illustrated in FIG. 1, data center module 200 illustrated in FIG. 2, data center module 300 illustrated in FIG. 3A-3B, etc.

In some embodiments, a data center module includes one or more scoop assemblies which can be coupled to a face of the data center module and are configured to redirect airflow out of the data center module, via the respective face, in one or more particular directions into the ambient environment. For example, in the illustrated embodiment, one or more scoop assemblies 380 can be coupled to a rear face 373 of the data center module housing 371, where the one or more scoop assemblies are configured to redirect a lateral air flow 360 of exhaust air exiting the module housing 371 via an exhaust air opening in the rear face 373 in a different direction than the illustrated direction of air flow 360, including the direction of redirected air flow 385. Such a different direction can include an upwards direction, such that the scoop assembly 380 is configured to redirect air flow 360 upwards as air flow 385 into the ambient environment 390. As a result, where one or more other data center modules 370 are positioned proximate to the rear face 373 of the illustrated module 370, so that a front face 372 of the one or more other data center modules face towards the rear face 373 of the illustrated module 370, a scoop assembly 380 coupled to the rear face 373 of the illustrated module 370 can redirect exhaust air flow 360 away from flowing into the front face 372 of the one or more other data center modules 370, thereby precluding the inlet airflow 350 into an opening in a front face 372 of the one or more data center modules 370 from including heated exhaust air flow 360 from the illustrated data center module 370. As a result, multiple data center modules 370 can be positioned together while mitigating a risk of exhaust air from one data center module preheating intake air to another data center module.

In some embodiments, one or more openings in a data center module housing include one or more sets of louvers, dampers, etc. The louvers can be fixed and configured to redirect airflow through the respective opening in which the respective set of louvers is included. For example, in the illustrated embodiments of FIG. 3A-B, a set of louvers are comprised in an exhaust opening 315 of a data center module and are configured to redirect a lateral airflow 360 through the opening 315 to flow in an upwards direction into the ambient environment 390. The louver assembly can be included in the face 312 of the housing 301, so that the housing conforms to one or various form factors corresponding to one or more shipping container standards. In some embodiments, one or more sets of dampers are comprised in one or more air openings in the data center module housing, where the dampers are configured to be adjustable to enable control of one or more of air flow direction through the one or more air openings, air flow rate through the one or more openings, some combination thereof, etc.

As used herein, "shipping container standard" can refer to a standard set of dimensions for intermodal containers. Such a standard can include one or more International Organization for Standardization ("ISO") standards for intermodal containers. Such a standard can include a Twenty Foot Equivalent Unit ("TEU") standard, RACE standard, ACTS standard, SECU standard, PODS standard, etc. For example, in some embodiments, data center module housing 301 has dimensions and attach points in accordance with a Twenty Foot Equivalent Unit ("TEU") standard. In one embodiment, housing 301 is the entire width and length of a standard TEU.

As shown in the illustrated embodiment, some embodiments of a data center module 300 include one or more side faces 308 which include one or more doors which enable access to the housing 301 interior. Such access can enable maintenance of rack computer systems installed therein, etc.

Figure 4A:
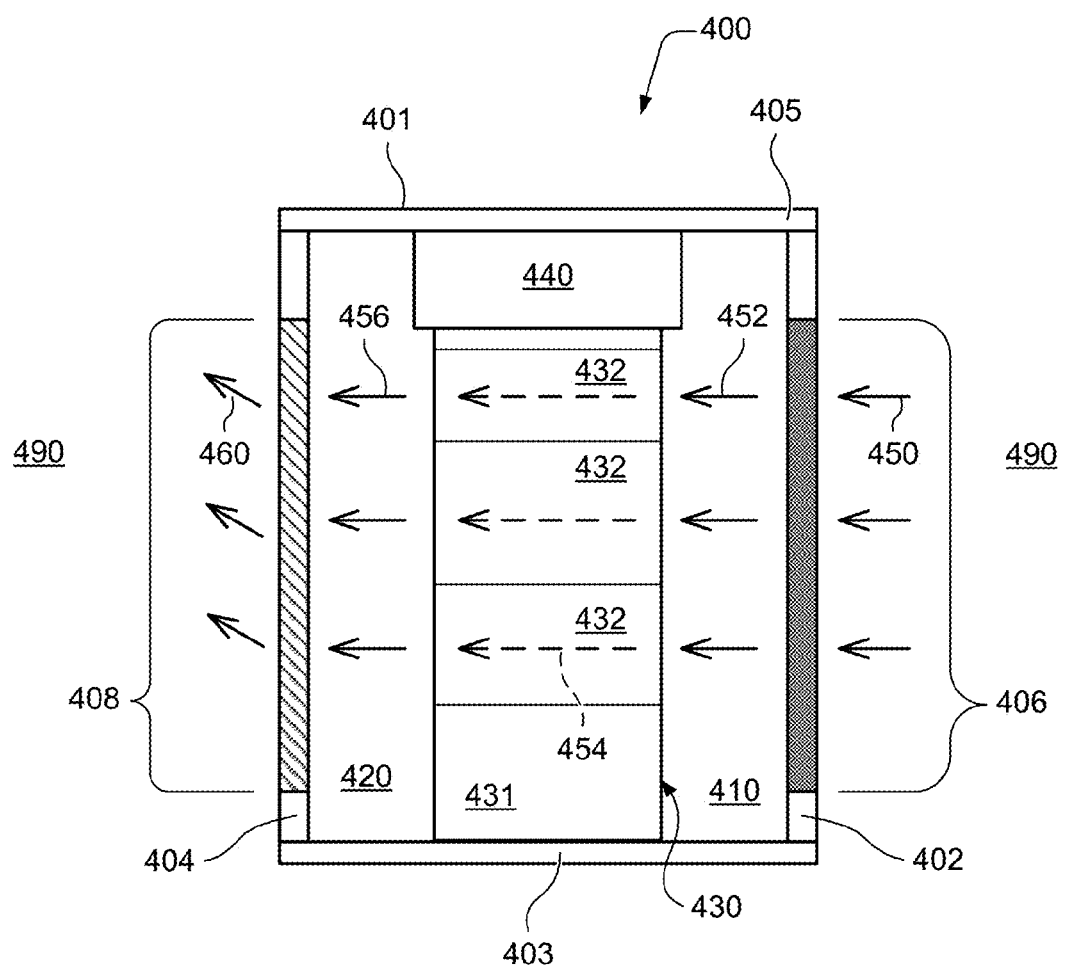
FIG. 4A illustrates a side view of an interior of a data center module configured to direct a lateral flow of air through the module interior to remove heat from one or more rows of rack computer systems, according to some embodiments.

FIG. 4A illustrates a side view of an interior of a data center module configured to direct a lateral flow of air through the module interior to remove heat from one or more rows of rack computer systems, according to some embodiments. Such flows of air 450, 452, 454, 456, 460, in some embodiments, flow at least partially orthogonally, perpendicularly, etc. relative to a row of rack computer systems including the illustrated rack computer system 430. The data center module 400 illustrated in FIG. 4A can be included, in some embodiments, in one or more data center modules illustrated in one or more of FIG. 1-3, etc.

Data center module 400 includes a module housing 401 which at least partially encompasses an interior which includes at least one rack computer system 430, intake air plenum 410, exhaust air plenum 420, and baffle element 440. Rack computer system 430 includes a rack 431 in which multiple computer systems 432 are installed. Housing 401 includes a top end 405, front face 402, bottom end 403, and rear face 404 which at least partially encompass an interior of the housing 401. Bottom end 403 can include a floor which at least partially supports the structural load of the rack computer systems 430 included in the interior. Front face 402 includes an intake air opening 406, which can include one or more filter assemblies, which is configured to direct a flow of ambient air 450 from ambient environment 490 and into an intake air plenum 410 which is included in the interior of housing 401 and extends along a front end of the rack computer systems 430 included in said interior. Air directed into plenum 410 via opening 406 can be referred to as intake air flow 452.

Intake air 452 can circulate through the intake air plenum 410 and can be directed from the plenum 410 through one or more computer systems 432 included in the rack computer system 430 to remove heat from heat producing components included therein. As shown, airflows 454 can pass from plenum 410, via the front end of rack computer system 430 and through various separate computer systems 432 included in the rack computer system, where each separate airflow 454 can remove heat from one or more heat producing components included in the various computer systems 432. Such airflow 454 includes intake air 452, directed through the computer systems 432 from plenum 410. Where such air 454 removes heat from heat producing components in rack computer system 430, such air can be referred to as exhaust air. The airflow 454, subsequent to passing through one or more computer systems 432, removing heat from heat producing components included therein, etc., can pass out of the rack computer system 430 via a rear end of the rack computer system 430 and into exhaust air plenum 420. Exhaust air plenum 420 extends along the rear end of the rack computer systems 430 included in the interior of housing 401. Airflow 454 which enters plenum 420 via the rear end of rack computer system 430 is referred to as exhaust air 456 and can circulate through plenum 420. Rear face 404 of the housing 401 includes an exhaust air opening 408 which can direct the exhaust air 456 out of the exhaust plenum 420, via opening 404, into ambient environment 490 as exhaust air 460. In the illustrated embodiment, exhaust air opening 408 includes a set of louvers configured to redirect air 456 to flow, as air 460, in a different direction relative to the air flow direction of air 456. In some embodiments, the set of louvers included in opening 408 comprise a set of adjustable dampers configured to adjustably control one or more of air flow direction and air flow rate through opening 408.

In some embodiments, a data center module is configured to remove heat from rack computer systems included therein, independently of any active cooling systems, via directing a lateral flow of air to flow laterally through the interior of the module. As shown in FIG. 4A, the flows of air 450-460 into, through, and out of the module 400 are lateral in flow direction. The flows 450 can be induced via one or more various gradients through the housing 401 interior, including a pressure gradient from opening 406 to opening 408 through the interior, a temperature gradient between the openings through the interior, etc. In some embodiments, the airflows 450-460 are induced based at least in part upon ambient air currents (e.g., wind).

In some embodiments, a data center module includes one or more various structures which at least partially partition separate spaces in the interior of the housing, so that the air passages between the separate spaces are restricted to air passages through one or more heat-generating components, so that airflow between the separate spaces is restricted to flow in thermal communication with the one or more heat producing components, and remove heat from same. Such separate spaces can include separate air plenums in the housing interior. In the illustrated embodiment, for example, where the rack computer system 430 in the housing interior extends vertically only partially through the interior, so that the rack computer system 430 does not extend fully from bottom element 403 to top element 405 and a gap is present between the rack computer system 430 and the top element, the module 400 includes a baffle element 440 which extends between the top of rack computer system 430 and the top element 405 and partitions the intake air plenum 410 and the exhaust air plenum 420 in the gap between rack computer system 430 and top end 405. As a result, air passages between the separate plenums 410, 420 are at least partially restricted to air passages through the various computer system 432 included in the rack computer system, so that airflow 454 between the plenums 410, 420 is restricted to flow through the computer systems 432 and remove heat generated by one or more heat producing components included in the computer systems 432.

Figure 4B:
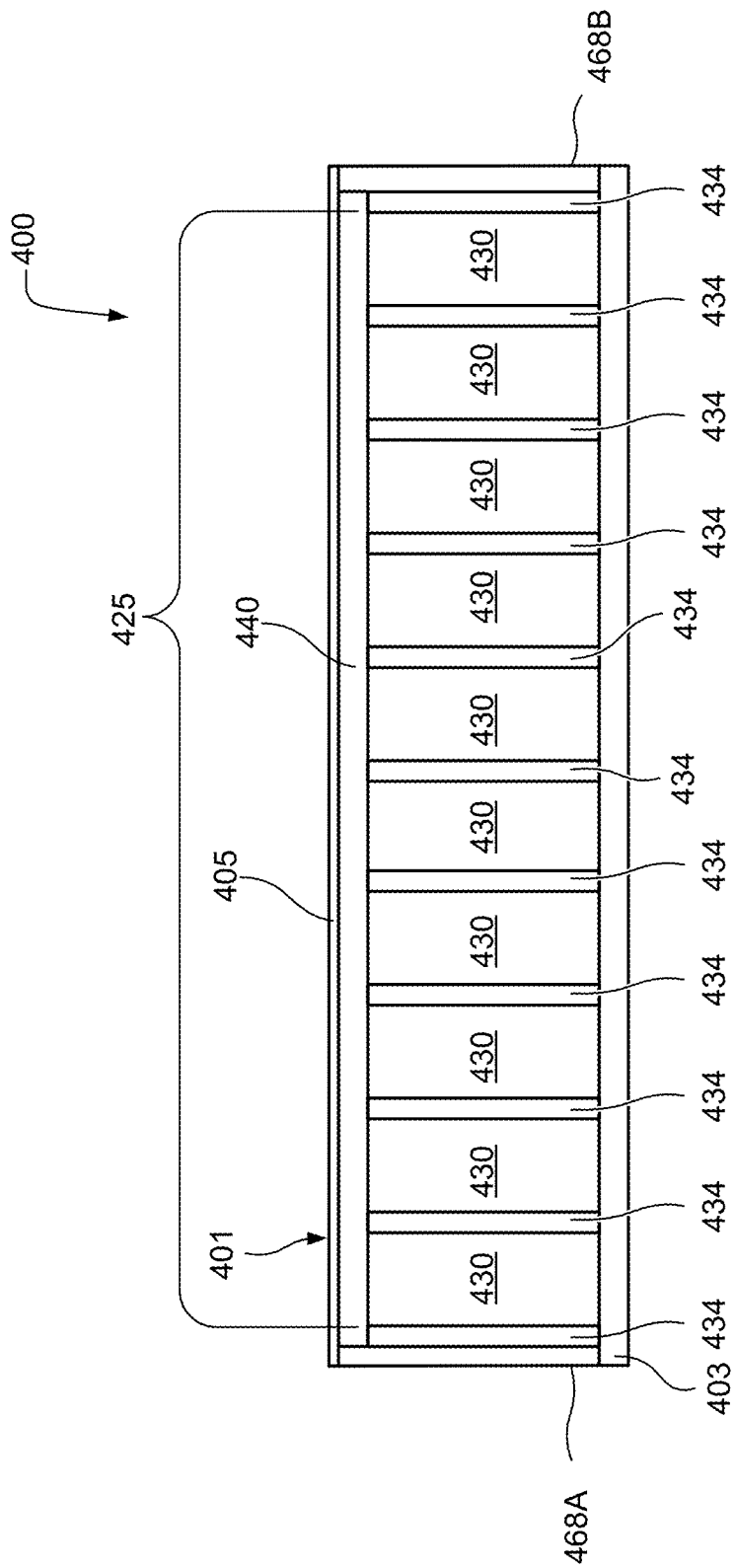
FIG. 4B illustrates a front view of an interior of a data center module including a row of rack computer systems extending between opposite side faces of the module, according to some embodiments.

FIG. 4B illustrates a front view of an interior of a data center module including a row of rack computer systems extending between opposite side faces of the module, according to some embodiments. The data center module 400 illustrated in FIG. 4B can be included, in some embodiments, in one or more data center modules illustrated in one or more of FIG. 1-3, FIG. 4A, etc.

Data center module 400 includes a module housing 401 which at least partially encompasses an interior which includes a row 425 of rack computer systems 430, dividers 434, and baffle element 440. Housing 401 includes a top end 401, side faces 468A-B, and bottom end 403 which at least partially encompass an interior of the housing 401. Bottom end 403 can include a floor which at least partially supports the structural load of the rack computer systems 430 included in the interior.

In some embodiments, a data center module includes one or more various structures which at least partially partition separate spaces in the interior of the housing, so that the air passages between the separate spaces are restricted to air passages through one or more heat-generating components, so that airflow between the separate spaces is restricted to flow in thermal communication with the one or more heat producing components, and remove heat from same. Such separate spaces can include separate air plenums in the housing interior. In the illustrated embodiment, for example, where the rack computer systems 430 in the housing interior extend vertically only partially through the interior, so that the rack computer systems 430 do not extend fully from bottom element 403 to top element 405 and a gap is present between the rack computer systems 430 and the top element, the module 400 includes a baffle element 440 which extends between the top of rack computer systems 430 and the top element 405 and partitions the separate air spaces on opposite sides of the row 425 of rack computer systems, which can include separate intake air plenums and exhaust air plenums, from each other. In addition, dividers 434 can each extend laterally between sides of adjacent rack computer systems 430 to partition the lateral space between the adjacent rack computer systems 430. In some embodiments, the dividers 434, baffle elements 440, some combination thereof, etc. are configured to secure the various rack computer systems 430 in specific positions in the module 400 interior. For example, a given pair of adjacent dividers 434 and baffle element 440 can be configured to collectively couple with the side and top ends of a rack computer system to secure the rack computer system in a space between the dividers 434 and baffle element 440.

Figure 5:
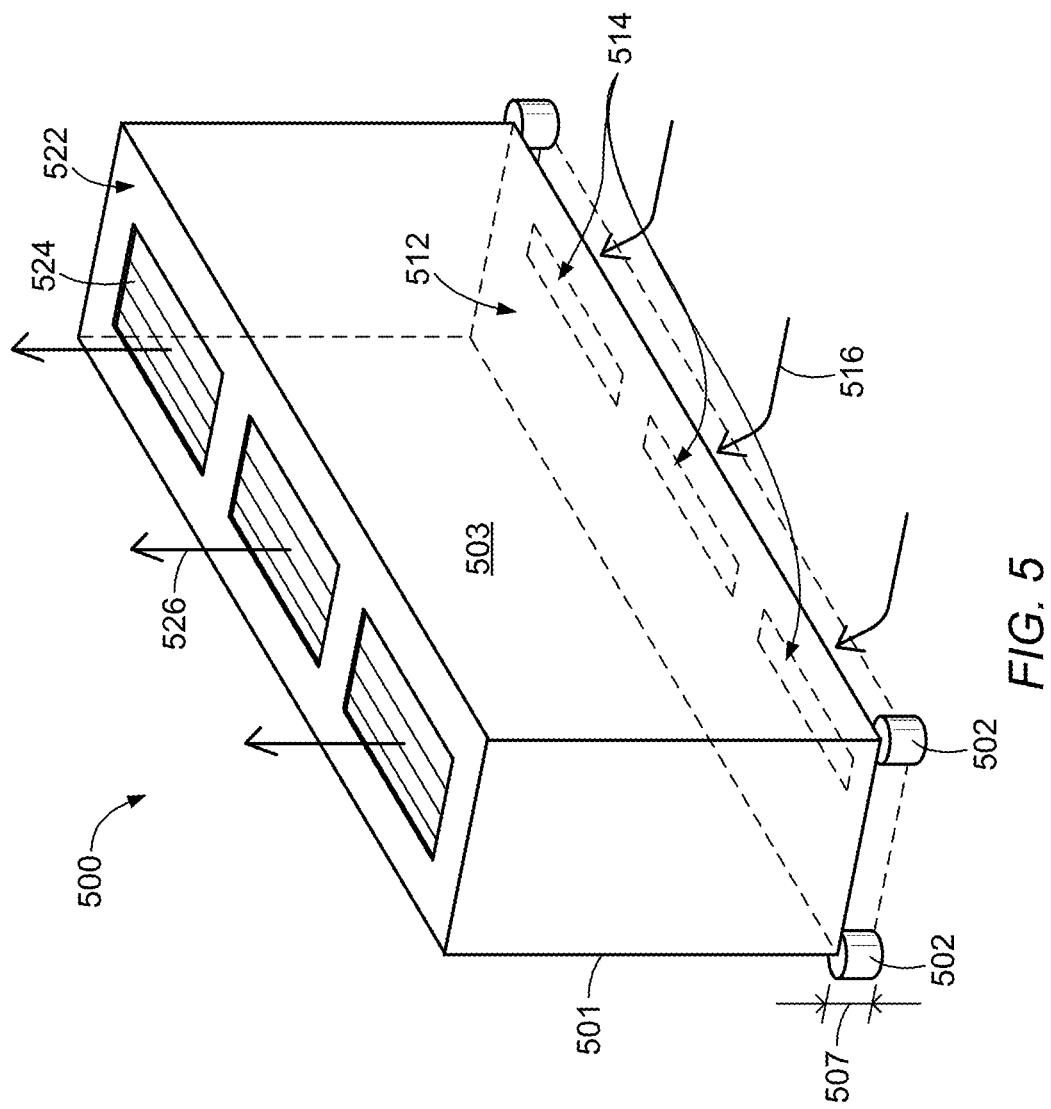
FIG. 5 illustrates a perspective view of a data center module configured to direct a flow of air at least partially in a vertical direction through the module interior, to remove heat from one or more rows of rack computer systems, according to some embodiments.

FIG. 5 illustrates a perspective view of a data center module configured to direct a flow of air at least partially in a vertical direction through the module interior, to remove heat from one or more rows of rack computer systems, according to some embodiments. The data center module 500 illustrated in FIG. 5 can be included, in some embodiments, in one or more data center modules illustrated in one or more of FIG. 1-4, etc.

The data center module 500 includes a housing 501 which at least partially encompasses an interior 503 of the housing. The housing includes at least a top end 522 and a bottom end 512, where the bottom end 512 includes intake air openings 514 and the top end 522 includes exhaust air openings 524. In some embodiments, one or more exhaust air openings included in a data center module, including openings 524 in the illustrated module 500, can include one or more sets of vents, louvers, gutters, etc. which can at least partially restrict entry of environmental elements into the module interior 503 via the ambient environment, while permitting passage of air through the openings 524. For example, where air openings in a module are located on a top end of the module housing, including the illustrated openings 524 on top end 522 of housing 501, one or more components configured to divert environmental elements in the ambient environment, including precipitation, dust, etc., from entering the interior 503 can be included in one or more of the openings 524. Such components can include one or more passive cooling systems, as described in U.S. patent application Ser. No. 14/043,660, "Passive Cooling System with Ambient Fluid Collection", filed Oct. 1, 2013 and incorporated by reference herein.

In some embodiments, a data center module is configured to direct an airflow through the interior of the module, at least partially in a vertical flow direction. Such vertical airflow can be based at least in part upon an air density gradient, air buoyancy gradient, temperature gradient, some combination thereof, or the like through the interior 503 from openings 514 to openings 524. For example, intake air entering interior 503 via the openings 514 in the bottom end 512 can pass through the interior 503 to openings 524 based at least in part upon rising through the interior due to a vertically-oriented air density gradient through the interior 503 from openings 514 to openings 524. The module 500 can be configured to direct ambient air 516 from an ambient environment, into interior 503 through the openings 514 in the bottom end 512, and to direct exhaust air 526 out of interior 503, via openings 524.

In some embodiments, a data center module 500 is configured to be positioned on one or more structural supports 502 so that the data center module 500 is positioned in an elevated position. As a result, the bottom end 512 is elevated over a space 507 between the module 500 and a surface which at least partially corresponds to the height of the supports 502. Positioning the module 500 in an elevated position can enable ambient air 516 to pass through space 507 and flow from space 507 beneath bottom end 512 into interior 503 of module 500 via the openings 514 which are in flow communication with space 507. Such directed flow can be based at least in part upon an air density gradient from space 507 into interior 503 across openings 514, an air pressure gradient across same, etc.

In some embodiments, module 500 includes a row of rack computer systems in the interior 503, where the row extends between opposite side faces, generally in parallel with the direction through which the openings 514, 524 extend between the same opposite side faces. As the direction of airflows 516, 526 is shown to flow generally orthogonally to the direction through which the openings 514, 524 extend between opposite side faces of module 500, the air flows 516, 526 can be understood to flow at least partially orthogonally, perpendicularly, etc. relative to a row of rack computer systems extending between opposite side faces of module housing 501.

Figure 6:
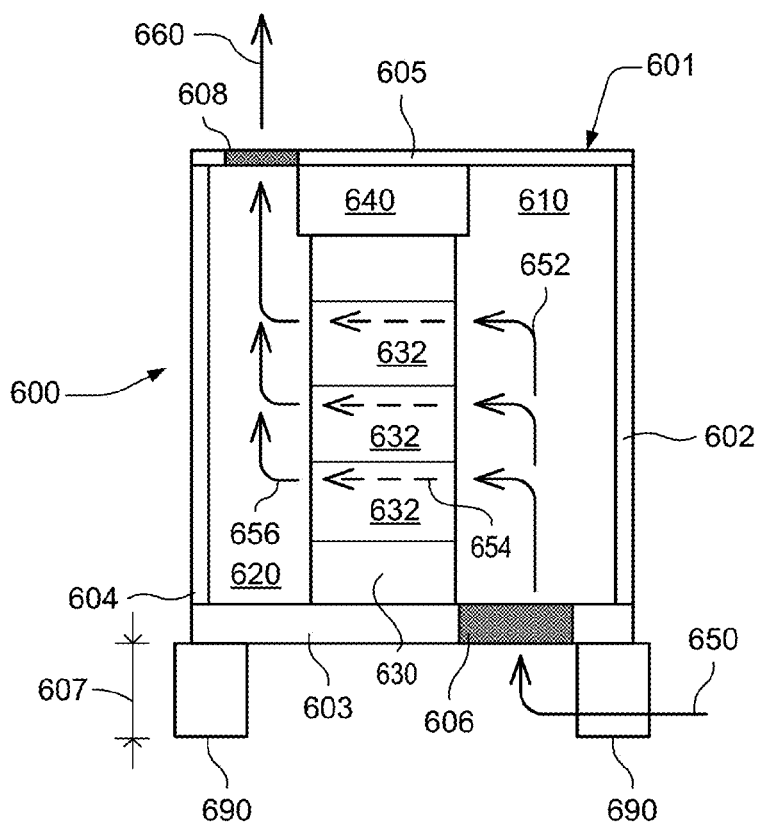
FIG. 6 illustrates a side view of an interior of a data center module configured to direct a flow of air at least partially vertically through the module interior to remove heat from a row of rack computer systems, according to some embodiments.

FIG. 6 illustrates a side view of an interior of a data center module configured to direct a flow of air at least partially vertically through the module interior to remove heat from a row of rack computer systems, according to some embodiments. Such flows of air 650, 652, 654, 656, 660, in some embodiments, flow at least partially orthogonally, perpendicularly, etc. relative to a row of rack computer systems including the illustrated rack computer system 630. The data center module 600 illustrated in FIG. 6 can be included, in some embodiments, in one or more data center modules illustrated in one or more of FIG. 1-5, etc.

Data center module 600 includes a module housing 601 which at least partially encompasses an interior which includes at least rack computer system 630, intake air plenum 610, exhaust air plenum 620, and baffle element 640. Housing 601 includes a top end 605, front face 602, bottom end 603, and rear face 604 which at least partially encompass an interior of the housing 601. Bottom end 603 can include a floor which at least partially supports the structural load of the rack computer systems 630 included in the interior. Front face 602 bounds an intake air plenum 610 in the housing interior, where the intake air plenum 610 bounds a front end of the rack computer systems 630 and is configured to direct intake air received into plenum 610 from an ambient environment to flow through computer system 632 included in the rack computer systems 630 via the front end of the rack computer systems 630 which faces the plenum 610. Rear face 604 bounds an exhaust air plenum 620 in the housing interior, where the exhaust air plenum 620 bounds a rear end of the rack computer systems 630 and is configured to receive exhaust air directed into plenum 620 via the rear end of the rack computer systems 630 to flow through out of the housing 601 interior and into an ambient environment.

In some embodiments, a data center module is configured to direct air to flow at least partially vertically between opposite top and bottom ends of the module housing. Such directed airflow can include a vertical airflow upwards through the housing interior, from an intake air opening in a bottom end of the housing, to an exhaust air opening in a top end of the housing. Such direct airflow can be induced based at least in part upon one or more gradients across the housing interior between the openings in the top and bottom ends, including an air density gradient, buoyancy gradient, etc. For example, cooling air directed into the housing interior via an opening at the bottom end can be warmed in the interior, based at least in part upon removing heat from various heat producing components therein, and such warmed air can be displaced upwards through the module interior by additional cooling air to an exhaust opening at the top of the interior, from which the warmed air can exit back into the ambient environment.

In the illustrated embodiment, module 600 is configured to direct ambient air 650 upwards into the intake air plenum 610 as intake air 652, via intake air opening 606 in the bottom end 603 of the housing 601. The ambient air 650 can be directed upwards into the plenum 610 from a space 607 in the ambient environment over which the module housing 601 is mounted on support structures 690. The ambient air 650 can be directed upwards into plenum 610 via one or more gradients across opening 606 from space 607 to plenum 610.

In addition, module 600 is configured to direct the intake air 652 from plenum 610 through the various computer systems 632 included in a rack computer system 630 in the housing 601 interior. Intake air plenum 610 can extend along a front side of at least rack computer system 630, and module 600 can be configured to direct the intake air 652 to pass from plenum 610 and into computer systems 632 via the front end of the rack computer system 630. Such intake air passing into the rack computer systems 630 can flow 654 through the computer systems, from the front end of the rack computer system 630 to the rear end of the rack computer system 630, to remove heat from one or more heat producing components included in the computer systems 632. As shown in the illustrated embodiment, while intake air flow 652 through plenum 610 can be an upwards vertical flow through plenum, air flow 654 through the rack computer system 630 can be at least partially lateral.

Module 600 is configured to direct airflow through the computer system 632, which exits the rack computer system 630 via a rear end of the rack computer system 630 into an exhaust air plenum 620 extending along the rear end of the rack computer system 630 as exhaust air 656, to flow vertically upwards through plenum 620 to an exhaust air plenum 608 in the top end 605 of the module housing 601, through which the exhaust air 656 can pass into the ambient environment as exhaust airflow 660.

In some embodiments, a data center module is configured to remove heat from rack computer systems included therein, independently of any active cooling systems, via directing a flow of air to flow vertically through the interior of the module. As shown in FIG. 6, the flows of air into, and out of, the module 600 are at least partially vertical and upwards in flow direction. The flows 652-656 can be induced via one or more various gradients through the housing 601 interior, including a pressure gradient from opening 606 to opening 608 through the interior, a temperature gradient between the openings through the interior, etc. In some embodiments, the airflows 652-656 are induced based at least in part upon ambient air currents (e.g., wind). For example, module 600 can be configured to generate a vertically oriented air density gradient upwards from the bottom end 603 to the top end 605 in the housing interior, so that an upwards airflow into the interior (650), through the interior (652-656), and out of the interior (660) is induced.

In some embodiments, a data center module includes one or more various structures which at least partially partition separate spaces in the interior of the housing, so that the air passages between the separate spaces are restricted to air passages through one or more heat-generating components, so that airflow between the separate spaces is restricted to flow in thermal communication with the one or more heat producing components, and remove heat from same. Such separate spaces can include separate air plenums in the housing interior. In the illustrated embodiment, for example, where the rack computer system 630 in the housing interior extends vertically only partially through the interior, so that the rack computer system 630 does not extend fully from bottom element 603 to top element 603 and a gap is present between the rack computer system 630 and the top element, the module 600 includes a baffle element 640 which extends between the top of rack computer system 630 and the top element 605 and partitions the intake air plenum 610 and the exhaust air plenum 620 in the gap between rack computer system 630 and top end 605. As a result, air passages between the separate plenums 610, 620 are at least partially restricted to air passages through the various computer system 632 included in the rack computer system, so that airflow 654 between the plenums 610, 620 is restricted to flow through the computer systems 632 and remove heat generated by one or more heat producing components included in the computer systems 632.

Figure 7:
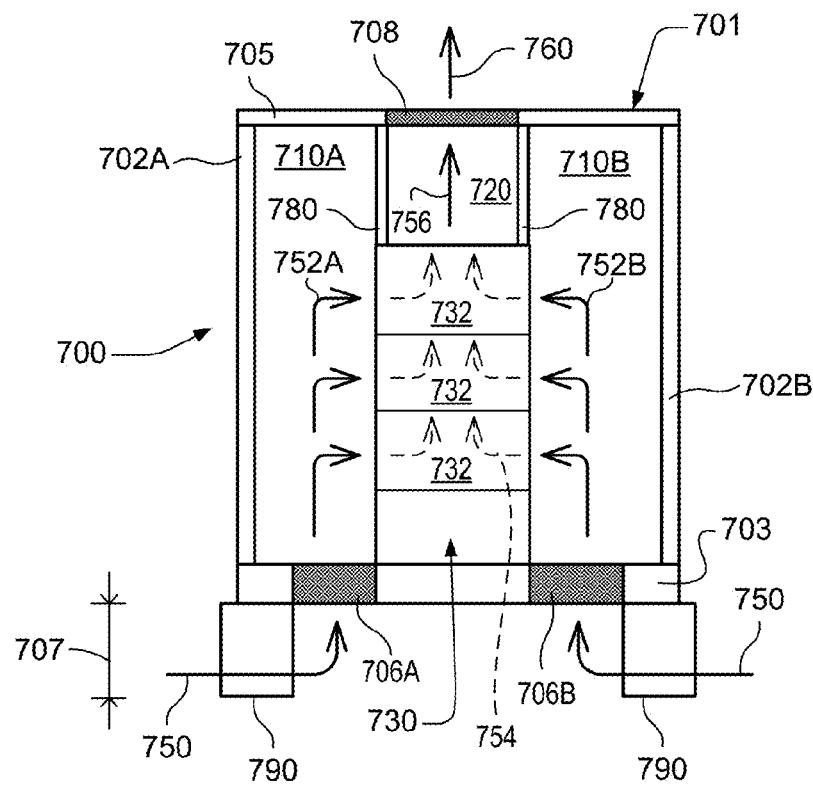
FIG. 7 illustrates a side view of an interior of a data center module configured to direct two flows of air at least partially vertically through the module interior, via two separate intake air plenums on opposite sides of one or more rows of rack computer systems, to remove heat from the one or more rows of rack computer systems, according to some embodiments.

FIG. 7 illustrates a side view of an interior of a data center module configured to direct two flows of air at least partially vertically through the module interior, via two separate intake air plenums on opposite sides of one or more rows of rack computer systems, to remove heat from the one or more rows of rack computer systems, according to some embodiments. Such flows of air 750, 752A-B, 754, 756, 760, in some embodiments, flow at least partially orthogonally, perpendicularly, etc. relative to a row of rack computer systems including the illustrated rack computer system 730. The data center module 700 illustrated in FIG. 7 can be included, in some embodiments, in one or more data center modules illustrated in one or more of FIG. 1-6, etc.

Data center module 700 includes a module housing 701 which at least partially encompasses an interior which includes at least rack computer system 730, intake air plenums 710A-B extending along opposite sides of the rack computer system 730, an exhaust air plenum 720 above the rack computer system 730, and baffle elements 780 which at least partially partition the plenums 710A-B, 720 from each other. Housing 701 includes a top end 705, side faces 702A-B, and bottom end 703 which at least partially encompass an interior of the housing 701. Bottom end 703 can include a floor which at least partially supports the structural load of the rack computer systems 730 included in the interior. Each of side faces 702A-B bounds a separate proximate intake air plenum 710A-B in the housing interior, where each separate intake air plenum 710A-B bounds a separate side end of the rack computer system 730 and is configured to direct intake air received into each of plenums 710A-B from an ambient environment to flow through computer systems 732 included in the rack computer system 730 via the separate side ends of the rack computer systems 730 which each face a separate one of the separate plenums 710A-B. The rack computer system 730 is configured to direct air entering the rack computer system laterally from the separate intake air plenums 710A-B to flow upwards, as air flows 754, to the exhaust air plenum 720 as exhaust air 756 via a top end of the rack computer system 730.

In some embodiments, a data center module is configured to direct air to flow at least partially vertically between opposite top and bottom ends of the module housing. Such directed airflow can include a vertical airflow upwards through the housing interior, from an intake air opening in a bottom end of the housing, to an exhaust air opening in a top end of the housing. Such direct airflow can be induced based at least in part upon one or more gradients across the housing interior between the openings in the top and bottom ends, including an air density gradient, buoyancy gradient, etc. For example, cooling air directed into the housing interior via an opening at the bottom end can be warmed in the interior, based at least in part upon removing heat from various heat producing components therein, and such warmed air can be displaced upwards through the module interior by additional cooling air to an exhaust opening at the top of the interior, from which the warmed air can exit back into the ambient environment.

In the illustrated embodiment, module 700 is configured to direct separate flows of ambient air 750 upwards into the separate intake air plenum 710A-B as separate flows of intake air 752A-B, via separate intake air openings 706A-B, each corresponding to the separate intake air plenums 710A-B, in the bottom end 703 of the housing 701. The ambient air 750 can be directed upwards into the plenums 710A-B from a space 707 in the ambient environment over which the module housing 701 is mounted on support structures 790. The ambient air 750 can be directed upwards into the separate plenums 710A-B via one or more gradients across openings 706A-B from space 707 to the corresponding separate plenums 710A-B. Each separate intake air plenum 710A-B extends laterally along a separate side end of the rack computer system 732, where the rack computer system 732 can be included in a row of rack computer systems, so that the intake air plenums 710A-B extend along separate side ends of the row of rack computer systems.

In addition, module 700 is configured to direct the intake air 752A-B from plenums 710A-B through the various computer systems 732 included in a rack computer system 730 in the housing 701 interior. Intake air plenums 710A-B can extend along separate side ends of at least rack computer system 730, and module 700 can be configured to direct the intake air 752A-B to pass from the corresponding separate plenums 710A-B and into computer systems 732 via separate side ends of the rack computer system 730. Such intake air passing into the rack computer systems 730 can flow 754 through the computer systems, from the side ends of the rack computer system 730 to a central portion of the rack computer system 730, to remove heat from one or more heat producing components included in the computer systems 732. As shown in the illustrated embodiment, while intake air flow 752 through plenums 710A-B can be an upwards vertical flow through plenum, air flow 754 through the rack computer system 730 can be at least partially lateral.

Module 700 is configured to direct airflow 754 at least partially vertically and upwards through the computer systems 732, and which exits the rack computer system 730 via a top end of the rack computer system 730 into an exhaust air plenum 720 extending above the top end of the rack computer system 730 as exhaust air 756, to flow vertically upwards through plenum 720 to an exhaust air opening 708 in the top end 705 of the module housing 701, through which the exhaust air 756 can pass into the ambient environment as exhaust airflow 760.

In some embodiments, a data center module is configured to remove heat from rack computer systems included therein, independently of any active cooling systems, via directing a flow of air to flow vertically through the interior of the module. As shown in FIG. 7, the flows of air into, and out of, the module 700 are at least partially vertical and upwards in flow direction. The flows 752A-B-756 can be induced via one or more various gradients through the housing 701 interior, including a pressure gradient from openings 706A-B to opening 708 through the interior, a temperature gradient between the openings through the interior, etc. In some embodiments, the airflows 752A-B-756 are induced based at least in part upon ambient air currents (e.g., wind). For example, module 700 can be configured to generate a vertically oriented air density gradient upwards from the bottom end 703 to the top end 705 in the housing interior, so that an upwards airflow into the interior (750), through the interior (752A-B-756), and out of the interior (760) is induced.

In some embodiments, a data center module includes one or more various structures which at least partially partition separate spaces in the interior of the housing, so that the air passages between the separate spaces are restricted to air passages through one or more heat-generating components, so that airflow between the separate spaces is restricted to flow in thermal communication with the one or more heat producing components, and remove heat from same. Such separate spaces can include separate air plenums in the housing interior. In the illustrated embodiment, for example, where the rack computer system 730 in the housing interior extends vertically only partially through the interior, so that the rack computer system 730 does not extend fully from bottom element 703 to top element 705 and a gap, which includes exhaust air plenum 720, is present between the top end of rack computer system 730 and the top end 705, the module 700 includes separate baffle elements 780 which each extend along separate side faces of the exhaust air plenum 720 between the top of rack computer system 730 and the top end 705 and partitions the exhaust air plenum 720 and a separate one of the intake air plenums 710A-B in the gap between rack computer system 730 and top end 705. As a result, air passages between the separate plenums 710A-B, 720 are at least partially restricted to air passages through the various computer systems 732 included in the rack computer system 730, so that airflow 754 between the plenums 710A-B, 720 is restricted to flow through the computer systems 732 and remove heat generated by one or more heat producing components included in the computer systems 732.

Figure 8:
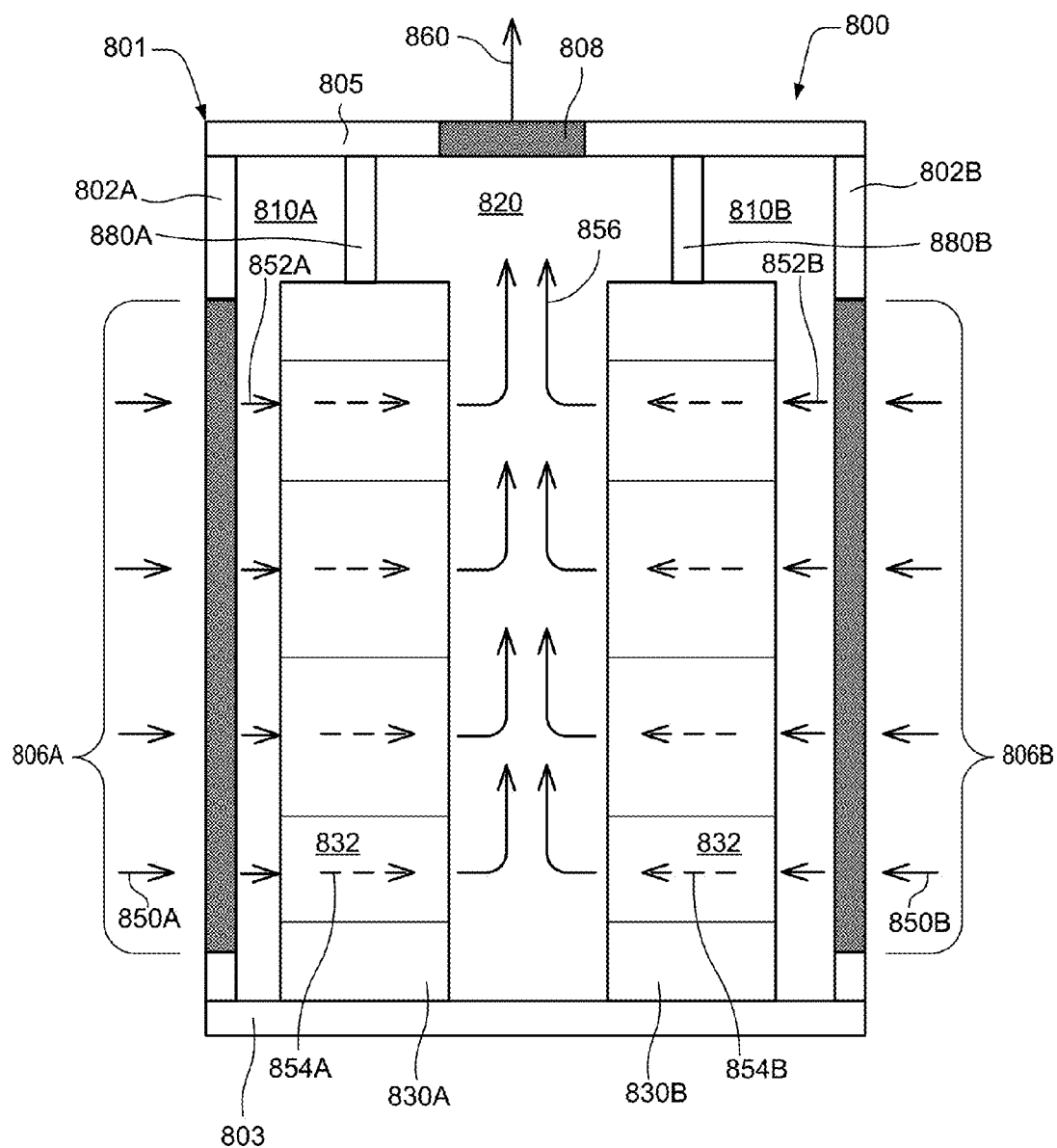
FIG. 8 illustrates a side view of an interior of a data center module configured to direct two lateral flows of air laterally through two separate intake air plenums on opposite sides of two separate rows of rack computer systems, and vertically through a common exhaust air plenum, to remove heat from the two rows of rack computer systems, according to some embodiments.

FIG. 8 illustrates a side view of an interior of a data center module configured to direct two lateral flows of air laterally through two separate intake air plenums on opposite sides of two separate rows of rack computer systems, and vertically through a common exhaust air plenum, to remove heat from the two rows of rack computer systems, according to some embodiments. Such flows of air 850A-B, 852A-B, 854A-B, 856, 860, in some embodiments, flow at least partially orthogonally, perpendicularly, etc. relative to a row of rack computer systems including the illustrated rack computer systems 830A-B. The data center module 800 illustrated in FIG. 8 can be included, in some embodiments, in one or more data center modules illustrated in one or more of FIG. 1-7, etc.

Data center module 800 includes a module housing 801 which at least partially encompasses an interior which includes at least two separate rack computer systems 830A-B which extend laterally, at respective rear ends, in a common elevation along opposite sides of a common exhaust air plenum 820, separate intake air plenums 810A-B each extending along separate front ends of separate rack computer systems 830A-B, and baffle elements 880A-B which at least partially partition the plenums 810A-B, 820 from each other. Housing 801 includes a top end 805, side faces 802A-B, and bottom end 803 which at least partially encompass an interior of the housing 801. Bottom end 803 can include a floor which at least partially supports the structural load of the rack computer systems 830A-B included in the interior. Each of side faces 802A-B bounds a separate proximate intake air plenum 810A-B in the housing interior, where each separate intake air plenum 810A-B bounds a separate front end of a separate rack computer system 830A-B and is configured to direct intake air 852A-B received into each of plenums 810A-B from an ambient environment to flow through computer systems 832 included in the respective separate rack computer system 830A-B via the front end of the respective rack computer systems 830 which faces the respective plenum 810A-B. The rack computer systems 830A-B are each configured to direct air entering the respective rack computer system laterally from the separate intake air plenums 810A-B to flow laterally, as air flows 854A-B, to the exhaust air plenum 820 as exhaust air 856 via a rear end of the respective rack computer system 830A-B.

In some embodiments, a data center module is configured to direct air to flow at least partially laterally into an interior of the module housing and to flow vertically out of the module housing. Such directed airflow can include separate lateral airflows into the separate intake air plenums via separate intake air openings 806A-B included in the separate side faces 802A-B of the module, a vertical airflow upwards through the exhaust air plenum 820 to an exhaust air opening 808 in a top end 805 of the housing 801. Such directed airflow can be induced based at least in part upon one or more gradients across the housing interior between the openings in the top and bottom ends, including an air density gradient, buoyancy gradient, etc. For example, cooling air directed into the housing interior via an opening at the side face of the housing can be warmed in the interior, based at least in part upon removing heat from various heat producing components therein, and such warmed air can be displaced upwards through the module interior by additional cooling air to an exhaust opening at the top of the interior, from which the warmed air can exit back into the ambient environment.

In the illustrated embodiment, module 800 is configured to direct separate flows of ambient air 850A-B laterally into the separate intake air plenums 810A-B as separate flows of intake air 852A-B, via separate intake air openings 806A-B, each corresponding to the separate intake air plenums 810A-B, in the separate side faces 802A-B of the housing 801. The ambient air 850A-B can be directed laterally into the separate plenums 810A-B via one or more gradients across openings 806A-B from the ambient environment to the corresponding separate plenums 810A-B. Each separate intake air plenum 810A-B extends laterally along a separate front end of a separate rack computer system 830A-B, where the rack computer system 830 can be included in a row of rack computer systems, so that the intake air plenums 810A-B extend along separate front ends of separate rows of rack computer systems, and the separate rows each bound a common exhaust air plenum 820 along separate rear ends of the separate rack computer systems 830A-B. For example, each separate rack computer systems 830A-B can be included in a separate row of 10 racks, so that module 800 includes a total of 20 racks.

In addition, module 800 is configured to direct the intake air 852A-B from plenums 810A-B through the various computer systems 832 included in the separate rack computer systems 830A-B in the housing 801 interior. Such intake air passing into the separate rack computer systems 830A-B from separate intake air plenums 810A-B can flow 854A-B through the computer systems, from the front ends of the separate rack computer systems 830A-B, to a common exhaust air plenum 820 extending between rear ends of the separate rack computer systems 830A-B, to remove heat from one or more heat producing components included in the computer systems 832. As shown in the illustrated embodiment, while exhaust air flow 856 through exhaust air plenum 820 can be vertical, intake air flow 852A-B through plenums 810A-B and air flow 854 through the rack computer systems 830A-B can be at least partially lateral.

Module 800 is configured to direct airflow 854A-B at least partially laterally into the exhaust air plenum 820, and which exits the rack computer systems 830A-B via respective rear ends of same which extend along the exhaust air plenum 820 as exhaust air 856, to flow vertically upwards through plenum 820 to an exhaust air opening 808 in the top end 805 of the module housing 801, through which the exhaust air 856 can pass into the ambient environment as exhaust airflow 860.

In some embodiments, a data center module includes one or more various structures which at least partially partition separate spaces in the interior of the housing, so that the air passages between the separate spaces are restricted to air passages through one or more heat-generating components, so that airflow between the separate spaces is restricted to flow in thermal communication with the one or more heat producing components, and remove heat from same. Such separate spaces can include separate air plenums in the housing interior. In the illustrated embodiment, for example, where the rack computer systems 830A-B in the housing interior extend vertically only partially through the interior, so that the rack computer systems 830A-B do not extend fully from bottom element 803 to top element 805 and a gap, which includes portions of exhaust air plenum 820 and intake air plenums 810A-B, is present between the top end of rack computer systems 830A-B and the top end 805, the module 800 includes separate baffle elements 880A-B which each extend along separate side faces of the exhaust air plenum 820 between the top of a separate rack computer system 830A-B and the top end 805 and partitions the exhaust air plenum 820 and a separate one of the intake air plenums 810A-B in the gap between the rack computer systems 830A-B and top end 805. As a result, air passages between the separate plenums 810A-B, 820 are at least partially restricted to air passages through the various computer systems 832 included in the rack computer systems 830A-B, so that airflow 854 between the plenums 810A-B, 820 is restricted to flow through the computer systems 832 and remove heat generated by one or more heat producing components included in the computer systems 832.

Figure 9:
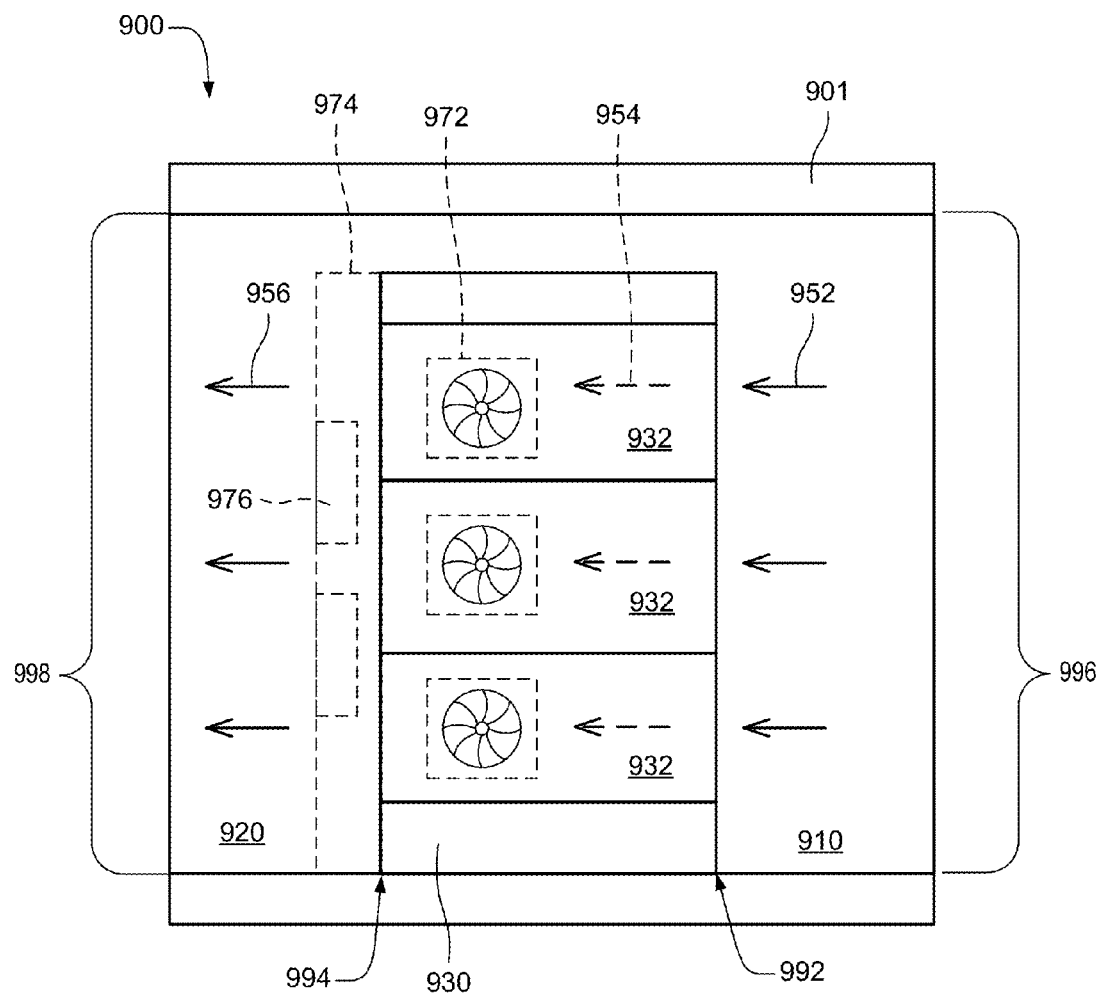
FIG. 9 illustrates a side view of an interior of a data center module configured to at least partially induce airflow through the module interior to remove heat from one or more rows of rack computer systems, based at least in part upon operation of one or more air moving devices associated with the one or more rows of rack computer systems, according to some embodiments.

FIG. 9 illustrates a side view of an interior of a data center module configured to at least partially induce airflow through the module interior to remove heat from one or more rows of rack computer systems, based at least in part upon operation of one or more air moving devices associated with the one or more rows of rack computer systems, according to some embodiments. Such flows of air 952, 954, 956, in some embodiments, flow at least partially orthogonally, perpendicularly, etc. relative to a row of rack computer systems including the illustrated rack computer system 930. The data center module 900 illustrated in FIG. 9 can be included, in some embodiments, in one or more data center modules illustrated in one or more of FIG. 1-8, etc.

In some embodiments, a data center module is configured to direct air through the module interior to remove heat from rack computer systems included therein based at least in part upon air moving devices included in the rack computer systems, coupled to the rack computer systems, some combination thereof, etc. As a result, airflow through the module interior to remove heat can be induced without air handling components external to, or separate from, the rack computer systems. For example, where each rack computer system includes computer systems which include internal air moving devices configured to induce airflow through the individual computer system to remove heat therefrom, the total air moving devices of the computer systems in the rack computer system can collectively generate a gradient through the interior of the module across the rack computer system, which can induce an airflow through the module interior.

In the illustrated embodiment, for example, data center module 900 includes a module housing which at least partially encompasses an interior in which rack computer system 930 is installed. Rack computer system 930 includes computer systems 932 which each include at least one internal air moving device 972 configured to induce airflow 954 through the respective individual computer system 932.

As shown in the illustrated embodiment, the total air moving devices 972 included in the computer systems 932 of rack computer system 930 can be configured to collectively generate an air pressure gradient across the rack computer system, from the front end 992 of the rack computer system 932 to an exhaust end 994 of the rack computer system 930. Such a generated gradient can induce an airflow 954 through each computer system from end 992 towards end 994. In addition, the gradient generated by operation of air moving devices 972 can extend at least partially from an intake air opening 996 into the module housing interior to at least the air moving devices 972, so that the air moving devices 972 can operate to draw intake air flow 952 into the intake air plenum 910 via openings 996 and from plenum 910 into the various computer systems 932 as airflow 954. In addition, the air moving devices 972 can discharge airflow 954 into the exhaust air plenum 920 as exhaust airflow and further discharge said exhaust air 956 out of the module housing 901 interior and into the ambient environment via an exhaust air opening 998 in the housing 901.

In some embodiments, a rack computer system 930 includes a fan door 974 structure, mounted to either a front end 992 or rear end 994 of the rack computer system 930, which includes air moving devices 976 which are configured to generate an air pressure gradient to direct air to flow 954 through the computer systems in the rack computer system 930 from front end 992 to the rear end 994. In some embodiments, the air moving devices 976 in such a fan door structure can collectively generate an air pressure gradient across at least a portion of the module housing 901 interior to induce airflow through the interior to remove heat from the module 900 without an active cooling system which utilizes active chilling of such airflow.

In some embodiments, a data center module does not include any air moving devices within the housing of the data center module, such that air moving devices are not present in any equipment installed in the interior of the housing of the data center module, and airflow through the housing interior is induced by one or more various air flow gradients through the interior which are established based at least in part upon the structure of the data center module. For example, with reference to the data center module 600 illustrated in FIG. 6, the data center module 600, in some embodiments, does not include any air moving devices, such that none of the rack computer systems 630 installed in the data center module include any air moving devices, and airflow 650-660 through the interior of housing 601 is induced based at least in part upon one or more air flow gradients between intake air opening 606 and exhaust opening 608. Such one or more air flow gradients can include one or more of an air buoyancy gradient, a temperature gradient, and air density gradient, some combination thereof, etc. For example, the structure of data center module, which includes the intake air opening 606 established in the bottom end 603 of housing 601, and the exhaust air opening 608 established in the top end 605 of the housing, can establish an air density gradient from the opening 606 in the bottom end 603, through the interior of housing 601, and to the opening 608 in the top end 605.

Figure 10:
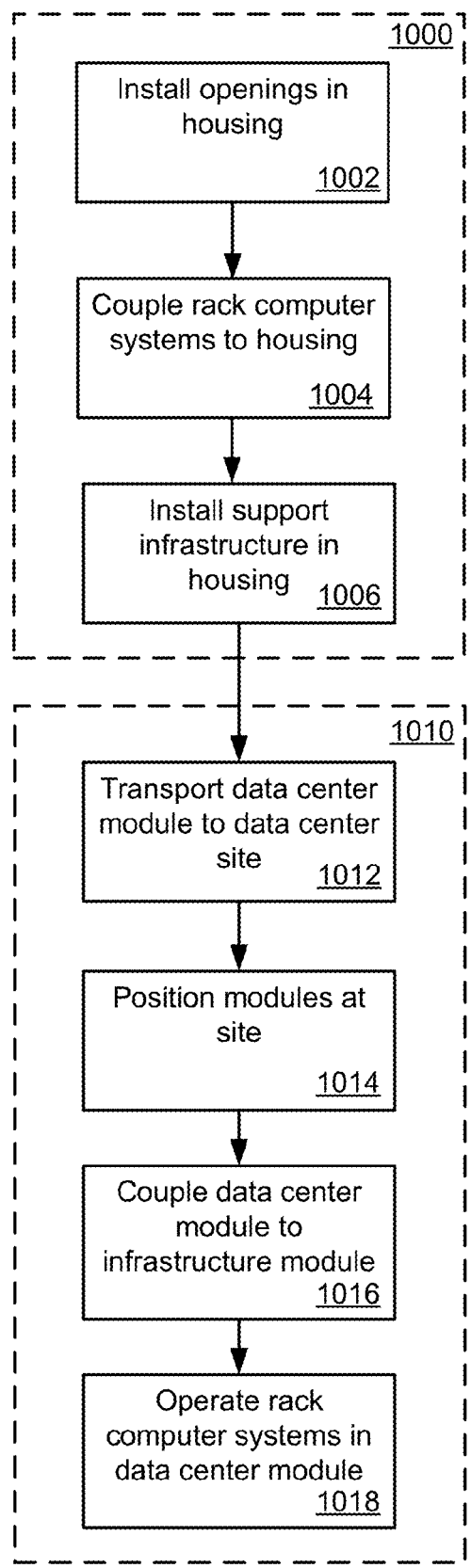
FIG. 10 illustrates providing computing capacity, independently of active cooling, via a modular data center computing system, according to some embodiments.

FIG. 10 illustrates providing computing capacity, independently of active cooling, via a modular data center computing system, according to some embodiments. Such providing can be implemented with regard to data center modules illustrated in one or more of FIGS. 1-9.

At 1000, the data center modules are fabricated. Such fabrication can be implemented at a fabrication site which is separate from a date center site. At 1002, one or more openings are installed in the module housing. Such openings can include one or more intake air openings and one or more exhaust air openings. Such openings can be installed in various ends of the module housing. For example, one intake air opening can be installed in a front face of the housing, and one exhaust air opening can be installed in a rear face of the housing. In another example, two intake air openings can be installed in opposite side faces of the housing, extending in parallel with rows of rack computer systems extending through the module interior, and one or more exhaust air openings can be installed in a top end of the module housing. In another example, one or more intake air openings can be installed in a bottom end of the housing, and one or more exhaust air openings can be installed in a top end of the housing.

The intake air openings are installed in one or more ends of the housing, so that each intake air opening is in flow communication with an intake air plenum which extends in parallel along at least one side of at least one row of rack computer systems in the module interior and each intake air opening is configured to direct ambient air from an ambient environment into at least one intake air plenum as intake air. The exhaust air openings are installed in one or more ends of the housing, so that each exhaust air opening is in flow communication with an exhaust air plenum which extends in parallel along at least one rear end, top end, some combination thereof, etc. of at least one row of rack computer systems in the module interior and each exhaust air opening is configured to direct exhaust air from the exhaust air plenum into the ambient environment.

Installing one or more of the intake air openings, exhaust air openings, etc. can include installing one or more semi-permeable screens, filter assemblies, etc. in one or more of the installed openings. For example, installing one or more intake air openings in an end of the module housing can include installing a filter assembly in the one or more intake air openings, so that the filter assembly extends at least partially across the opening and is configured to filter at least some environmental elements out of ambient air directed through the intake air opening and into an intake air plenum. In another example, installing one or more intake air openings, exhaust air openings, etc. in an end of the module housing can include installing a semi-permeable screen, including an expanded steel mesh structure, chain link fence structure, etc. in the one or more openings, so that the screen can at least partially preclude various elements from entering the module housing interior from the ambient environment through the respective opening.

At 1004, one or more rack computer systems are coupled to a portion of a module housing, so that the rack computer systems are mounted in the interior of the module housing. Such rack computer systems can be coupled, in one or more various slot positions established by various divider elements, baffle elements, etc. to establish one or more particular arrangements of the rack computer systems in the module housing interior. Rack computer system arrangements in the module housing interior can include one or more rows of rack computer systems, which can extend at least partially, entirely, etc. between separate side faces of the module housing. Installing one or more rows of rack computer systems in a module housing can include at least partially establishing one or more air plenums in the housing interior. For example, where a module housing includes an intake air opening installed in one end (e.g., a "front face") of the housing, an exhaust air opening installed in an opposite end (e.g., a "rear face") of the housing, and a row of rack computer systems is installed to extend in parallel with the opposite ends, an intake air plenum can be established between the one end and a proximate end of the row of rack computer systems, while an exhaust air plenum can be established between the opposite end and another opposite end of the row of rack computer systems.

At 1006, one or more instances of support infrastructure are installed in the module housing interior to couple the one or more rack computer systems coupled therein to one or more external infrastructure connections. In an example, installing instances of support infrastructure can include coupling instances of power cabling to power inlets of the rack computer systems, routing the cabling to an external power connection of the module, and coupling the cabling to the external power connection, so that the power cabling is configured to distribute electrical power, received from an external power source at the module via the external power connection, to the various rack computer systems via the power inlets of said rack computer systems. In another example, installing instances of support infrastructure can include coupling instances of network communication cabling to network ports of the rack computer systems, routing the cabling to an external network communication connection of the module, and coupling the cabling to the external network communication connection, so that the network communication cabling is configured to communicatively couple the rack computer systems to one or more communication networks via the external network communication connection.

Upon fabrication, one or more data center modules can be transported to a storage location, where the data center modules can be stored until needed to provide computing capacity at a data center site. In some embodiments, each data center module includes at least one identifier on an exterior portion thereof, where the identifier can be used to identify a particular data center module for storage, transport to another location, deployment from storage to a site, removal from a site to storage, etc. For example, a data center module can include a label, installed on one or more ends of the housing, which including an identifier which uniquely identifies the module. Such an identifier can include a barcode, RFID chip, etc.

At 1010, a data center module is deployed at a data center site to deploy computing capacity at the site. Such deployment can be temporary and based at least in part upon one or more of a particular amount of computing capacity needed at the site, a particular amount of computing capacity provided at the site from a fixed data center hall, etc. For example, where a data center is to be constructed at a data center site to provide at least a certain amount of computing capacity at such site, data center modules can be deployed at the site to provide the certain amount of computing capacity at the site while the data center hall is under construction. As computing capacity in the data center hall is brought on-line, the data center modules can be removed from the data center site and placed into storage.

The number of data center modules deployed at a data center site can be selected based on the computing capacity requirements associated with the data center site. For example, if a data center site in Facility Site A needs 38 server racks and Facility Site B needs 55 server racks, two 20-rack data center modules (which could accommodate up to 40 racks total) can be deployed at Facility Site A, and three 20-rack data center modules (which could accommodate up to 60 racks total) can be deployed at Facility B. In addition, over time, modules can be added to a modular computing system at a data center site if the computing capacity needed at the site increases, and modules can be removed from a modular computing system at the data center and redeployed if the computing capacity needed at the facility decreases.

At 1012, one or more data center modules are transported to the data center site. Such data center modules can be selected for transportation based at least in part upon identifiers included on an external end of the module. For example, where multiple data center modules are in storage at a storage location, one or more particular data center modules can be selected for deployment at a site, and such particular modules can be identified by one or more operators, scanning devices, etc. based at least in part upon interaction with identifiers of each of the particular data center modules.

In some embodiments, where multiple data center modules are selected to be deployed at a site to collectively provide a certain amount of computing capacity, two or more of the data center module can be transported separately to the site via separate delivery systems. For example, where the two or more data center modules are in a form factor corresponding to a shipping container standard, each separate data center module of the two or more data center modules can be separately transported to the data center site via a separate delivery truck.

In some embodiments, one or more infrastructure modules can be stored at one or more locations and can be transported to the data center site, concurrently with transport of one or more data center modules to the site. For example, where a certain number of data center modules configured to provide a collective amount of computing capacity are transported to a site to provide the collective computing capacity at the site, a number of infrastructure modules, which are configured to provide one or more particular types of infrastructure support and in sufficient amounts to support the provided collective computing capacity by the data center modules at the site, can be selected for deployment at the site and transported to the site.

In some embodiments, the infrastructure modules can include one or more electrical modules configured to provide electrical power to rack computer systems in one or more data center modules, network communication modules configured to provide network communication access to the rack computer systems in one or more data center modules, some combination thereof, etc. For example, a infrastructure module can include one or more instances of electrical power distribution components (e.g., transformers, generators, switching devices, uninterruptible power supplies, power distribution units, some combination thereof, or the like), one or more instances of network communication components (e.g., network switch devices, console switch devices, routers, etc.), some combination thereof, or the like.

At 1014, where the one or more data center modules, infrastructure modules, etc. are delivered to a data center site, the modules are positioned in one or more particular locations in the site to arrange the modules in a particular configuration. The modules may be arranged to maximize exposure of one or more ends of each of the modules to ambient airflow through the site. For example, where the data center modules include intake air openings on side faces, one or more sets of such modules can be positioned in a row arrangement, where the side faces including intake air openings extend in parallel with each other and face in one or more common directions, so that the modules in the set are positioned to receive ambient air from a common direction. In another example, where the data center modules include intake air openings on bottom ends, positioning the modules can include mounting one or more such modules on one or more support structures, so that the modules are mounted in an elevated position which establishes a space beneath the modules through which ambient air can flow and be drawn upwards into the modules via respective intake air openings in the bottom ends of the modules. In another example, where the modules delivered to a site include a mixture of data center modules and infrastructure modules, the data center modules and infrastructure modules can be positioned at the site in a n arrangement which minimizes the total amount of infrastructure conduits (e.g., cabling, bus bars, etc.) needed to couple external connections of the infrastructure modules with the external connections of the data center modules to support such data center modules.

In some embodiments, some or all of the modules delivered to a site can physically couple to one another to position the modules at the site. In certain embodiments, modules may be fastened together, such as by bolts or pins. In other embodiments, however, modules may not be fastened together, but simply be stacked or positioned next to one another. In some embodiments, adjoining modules may include aligning elements such as rails, pins, or keys. In certain embodiments, one or both of two adjoining modules, or two adjoining half modules, may include seal elements such that a seal is automatically made between the adjoining elements when they are coupled to one another.

At 1016, one or more data center modules positioned at a data center site are coupled, via respective external connections of the data center modules, with one or more connections of one or more infrastructure modules, via one or more instances of conduits, etc. Such coupling can configure the data center modules to receive one or more particular types of infrastructure support from the infrastructure modules to support computing operations by rack computer systems included in the data center modules. For example, where an infrastructure module includes one or more instances of electrical power distribution components configured to distribute electrical power, such coupling can include coupling one end of one or more instances of power cabling to an external connection of the infrastructure module, and further coupling another end of the one or more instances of power cabling to an external connection of one or more data center modules to configure the data center modules to receive electrical power from the infrastructure modules. A given infrastructure module can be coupled to multiple data center modules to provide one or more types of infrastructure support to multiple such modules. In addition, a given infrastructure module can be configured to provide multiple separate types of infrastructure. For example, an infrastructure modules can include both electrical power distribution components and network communication components, so that the infrastructure module is coupled to one or emo data center modules, via both power cabling and network communication coupling, to provide both electrical power support and network communication support to rack computer systems included in the data center modules.

As described further herein, because the data center modules are configured to remove heat from rack computer systems included therein without any active cooling systems which actively chill airflow through the modules, coupling a data center module to one or more infrastructure modules does not include coupling a data center module with any external air cooling modules, components, etc.

At 1018, one or more rack computer systems in one or more data center modules are operated to provide computing capacity at the data center site. The rack computer systems can be accessed remotely, via network communication infrastructure support.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A modular computing system for a data center, comprising:
   one or more data center modules, wherein each of the one or more data center modules comprise:
      a module housing including at least a front face, a rear face, and opposite side faces; and
      a row of rack computer systems extending between the opposite side faces in an interior of the module housing, wherein each of the rack computer systems comprises a front end proximate to the front face and a rear end proximate to the rear face; and
   one or more electrical modules coupled to at least one of the one or more data center modules, wherein at least one of the one or more electrical modules is configured to provide electrical power to at least one of the rack computer systems in the one or more data center modules;
   wherein each of the one or more data center modules does not include any connections to any active cooling system and is configured to remove heat from the one or more rack computer systems in the respective data center module independently of any active cooling system;
   wherein, to remove heat from the one or more rack computer systems in the respective data center module independently of any active cooling system, each of the one or more data center modules is configured to direct a flow of ambient air from an ambient environment, through the front face, through the row of rack computer systems from the front end to the rear end, and back into the ambient environment via the rear face.

2. The modular computing system of claim 1, wherein one or more of the front face and the rear face comprises a filter assembly configured to restrict at least some environmental elements from entering the interior of the module housing.

3. The modular computing system of claim 1, wherein at least one of the one or more electrical modules is configured to communicatively couple at least one of the rack computer systems in the one or more data center modules to a communication network.

4. The modular computing system of claim 1, wherein:
   each of the one or more data center modules is configured to be reversibly positioned and coupled to one or more electrical modules, at a data center site, to provide temporary computing capacity, concurrently with construction of a data center hall at the data center site; and
   each of the one or more data center modules is configured to be decoupled from the one or more electrical modules and removed from the data center site, based at least in part upon a determination that the data center hall is configured to provide computing capacity at the data center site.

5. An apparatus, comprising:
   a data center module which does not include any active cooling system connections and is configured to provide computing capacity independently of any active cooling system, wherein the data center module comprises:
      a module housing which at least partially encompasses a module interior;
      at least one row of rack computer systems extending, in the module interior, between opposite side faces of the module housing;
      at least one intake air opening configured to direct air from an ambient environment into an intake plenum of the module interior which is proximate to an intake end of the row of rack computer systems; and
      at least one exhaust air opening configured to direct air, from an exhaust plenum which is proximate to an exhaust end of the row of rack computer systems, out of the module interior and into the ambient environment;
   wherein, to provide computing capacity independently of any active cooling system, the data center module is configured to direct a flow of ambient air from the ambient environment, through the intake air opening into the intake plenum, from the intake plenum to the exhaust plenum through one or more rack computer systems in the row of rack computer systems, and through the exhaust air opening from the exhaust plenum to the ambient environment.

6. The apparatus of claim 5, wherein:
   the at least one intake air opening comprises a vertically-oriented opening in a vertically-oriented face of the module housing and is configured to direct a lateral airflow from the ambient environment into the intake plenum of the module interior which extends laterally along the intake end of each rack computer system in the row of rack computer systems.

7. The apparatus of claim 6, wherein:
   the at least one intake air opening comprises a filter assembly which is configured to at least partially filter the lateral airflow from the ambient environment into the intake plenum of the module interior; and
   the at least one exhaust air opening comprises a semi-permeable screen.

8. The apparatus of claim 6, wherein:
   the at least one exhaust air opening comprises a vertically-oriented opening in an opposite vertically-oriented face of the module housing and is configured to direct a lateral airflow from the exhaust plenum which extends laterally along the exhaust end of each rack computer system in the row of rack computer systems, out of the module interior and into the ambient environment; and
   to provide computing capacity independently of any active cooling system, the data center module is configured to direct a lateral flow of ambient air from an ambient environment, through the intake air opening into the intake plenum, from the intake plenum to the exhaust plenum through one or more rack computer systems in the row of rack computer systems, and through the exhaust air opening from the exhaust plenum to the ambient environment.

9. The apparatus of claim 6, wherein:
the at least one row of rack computer systems extending between opposite side faces in the module interior comprises at least two separate rows of rack computer systems extending between the same opposite side faces in the module interior;
the at least one intake air opening comprises two separate sets of vertically-oriented openings, on opposite vertically-oriented faces of the module housing, where each separate set of vertically-oriented openings is configured to direct ambient air from the ambient environment into a separate intake plenum, of at least two intake plenums, which is proximate to an intake end of a separate row of rack computer systems of the at least two separate rows of rack computer systems; and
the at least one exhaust air opening is configured to direct air, from an exhaust plenum which is proximate to an exhaust end of the row of rack computer systems, out of the module interior and into an ambient environment.

10. The apparatus of claim 5, wherein:
the data center module is configured to induce buoyancy-driven ventilation from the at least one intake air opening towards the at least one exhaust air opening through the module interior.

11. The apparatus of claim 10, wherein:
the at least one intake air opening comprises a horizontally-oriented opening in a bottom face of the module housing and is configured to direct a vertical airflow from the ambient environment into the intake plenum of the module interior which extends laterally along the intake end of each rack computer system in the row of rack computer systems;
the at least one exhaust air opening comprises a horizontally-oriented opening in a top face of the module housing and is configured to direct a vertical airflow from the exhaust plenum, out of the module interior, and into the ambient environment; and
to provide computing capacity independently of any active cooling system, the data center module is configured to direct a lateral flow of ambient air from an ambient environment, through the intake air opening into the intake plenum, from the intake plenum to the exhaust plenum through one or more rack computer systems in the row of rack computer systems, and through the exhaust air opening from the exhaust plenum to the ambient environment.

12. The apparatus of claim 5, wherein:
the data center module does not include any air moving devices, such that:
the at least one row of rack computer systems do not include any air moving devices; and
to direct a flow of ambient air from an ambient environment, through the intake air opening into the intake plenum, from the intake plenum to the exhaust plenum through one or more rack computer systems in the row of rack computer systems, and through the exhaust air opening from the exhaust plenum to the ambient environment, the data center module is configured to establish an air flow gradient between the at least one intake air opening and the at least one exhaust air opening, through an interior of the data center module, which induces the flow of ambient air.

13. The apparatus of claim 5, wherein the data center module is pre-fabricated and is in a form in accordance with at least one standard for shipping containers.

14. A method of providing computing capacity, comprising:
positioning one or more pre-fabricated data center modules comprising one or more rack computer systems at a data center site, wherein each of the one or more pre-fabricated data center modules does not include any active cooling system connections and is configured to provide computing capacity independently of any active cooling system;
coupling one or more pre-fabricated electrical modules to at least one of the data center modules, wherein at least one of the electrical modules is configured to provide one or more of electrical power support and network communication support to at least one rack computer system in one or more of the data center modules; and
operating at least one of the one or more pre-fabricated data center modules at the site to provide computing capacity, at the data center site, independently of any active cooling system.

15. The method of claim 14, wherein:
the one or more pre-fabricated data center module comprises:
a module housing which at least partially encompasses a module interior;
at least one row of rack computer systems extending between opposite side faces in the module interior;
at least one intake air opening configured to direct air from an ambient environment into an intake plenum of the module interior which is proximate to an intake end of the row of rack computer systems; and
at least one exhaust air opening configured to direct air, from an exhaust plenum which is proximate to an exhaust end of the row of rack computer systems, out of the module interior and into an ambient environment; and
providing computing capacity, at the data center site, independently of any active cooling system comprises directing a flow of ambient air from an ambient environment, through the intake air opening into the intake plenum, from the intake plenum to the exhaust plenum through one or more rack computer systems in the row of rack computer systems, and through the exhaust air opening from the exhaust plenum to the ambient environment.

16. The method of claim 15, wherein:
directing a flow of ambient air from an ambient environment, through the intake air opening into the intake plenum, from the intake plenum to the exhaust plenum through one or more rack computer systems in the row of rack computer systems, and through the exhaust air opening from the exhaust plenum to the ambient environment comprises:
operating one or more air moving devices included in one or more one rack computer systems in the at least one row of rack computer systems, to induce a flow of air through the one or more rack computer systems.

17. The method of claim 14, wherein:
the at least one intake air opening comprises a vertically-oriented opening in a vertically-oriented face of the module housing and is configured to direct a lateral airflow from the ambient environment into the intake plenum of the module interior which extends laterally along the intake end of each rack computer system in the row of rack computer systems.

18. The method of claim 14, comprising:
installing the intake air opening in the module housing, the installing further comprising installing at least one filter assembly at least partially across the installed intake air opening.

19. The method of claim 14, wherein:
operating at least one of the one or more pre-fabricated data center modules at the data center site to provide computing capacity, at the data center site, independently of any active cooling system comprises operating the at least one of the one or more pre-fabricated data center modules at the site to provide temporary computing capacity, concurrently with construction of a data center hall at the data center site; and the method further comprises decoupling the one or more pre-fabricated data center modules from the electrical module and removing the one or more pre-fabricated data center modules from the data center site, based at least in part upon a determination that the data center hall is configured to provide computing capacity at the data center site.

20. The method of claim 14, wherein the module housing is in a form in accordance with at least one standard for shipping containers.

\* \* \* \* \*